United States Patent
Rajwani et al.

(10) Patent No.: US 7,130,236 B2
(45) Date of Patent: Oct. 31, 2006

(54) LOW POWER DELAY CONTROLLED ZERO SENSITIVE SENSE AMPLIFIER

(75) Inventors: Iqbal Rajwani, Roseville, CA (US); Satish Damaraju, El Dorado Hills, CA (US)

(73) Assignee: Intel Corporation, Santa Clara, CA (US)

(*) Notice: Subject to any disclaimer, the term of this patent is extended or adjusted under 35 U.S.C. 154(b) by 26 days.

(21) Appl. No.: 11/081,276

(22) Filed: Mar. 16, 2005

(65) Prior Publication Data
US 2006/0209606 A1    Sep. 21, 2006

(51) Int. Cl.
*G11C 7/02* (2006.01)
(52) U.S. Cl. .................. 365/208; 365/207
(58) Field of Classification Search .............. None
See application file for complete search history.

(56) References Cited

U.S. PATENT DOCUMENTS

| | | | | |
|---|---|---|---|---|
| 5,113,090 A | * | 5/1992 | Imaizumi et al. ............ | 327/69 |
| 5,253,197 A | * | 10/1993 | Suzuki et al. ............... | 365/49 |
| 5,306,970 A | * | 4/1994 | Phillips ....................... | 327/57 |
| 5,453,947 A | * | 9/1995 | Seta et al. ................... | 365/49 |
| 6,618,313 B1 | | 9/2003 | Nguyen et al. | |
| 6,785,184 B1 | | 8/2004 | Nguyen et al. | |

OTHER PUBLICATIONS

Navid Azizi et al., "Low-Leakage Asymmetric-Cell SRAM," IEEE Transactions on Very Large Scale Integration (VLSI) Systems, vol. 11, No. 4, Aug. 2003, pp. 701-715.
Yen-Jen Chang et al., "Value-Conscious Cache: Simple Technique for Reducing Cache Access Power," Proceedings of the Design, Automation and Test in Europe Conference and Exhibition, 2004 IEEE, all pages.

* cited by examiner

*Primary Examiner*—Son Mai
(74) *Attorney, Agent, or Firm*—Blakely, Sokoloff, Taylor & Zafman LLP

(57) ABSTRACT

In one embodiment of the invention an integrated circuit is provided including a sense amplifier to read data from a memory cell that has a first transfer gate, a second transfer gate, a comparator, and a control circuit. The first transfer gate has a first pole coupled to a positive power supply. The second transfer gate has a first pole coupled to a bitline of the memory cell. The comparator has a first input coupled to a second pole of the first transfer gate, a second input coupled to a second pole of the second transfer gate, and an output coupled to the second input. The comparator compares signals on the first and second inputs and selectively generates a greater differential signal there-between. The control circuit turns off the comparator responsive to a logical zero being read from the memory cell avoiding the generation of the greater differential signal.

25 Claims, 13 Drawing Sheets

*FIG. 11A*
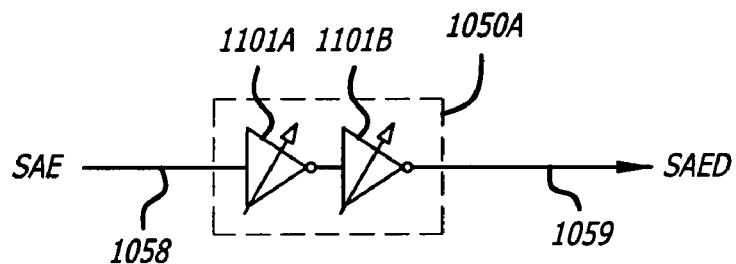
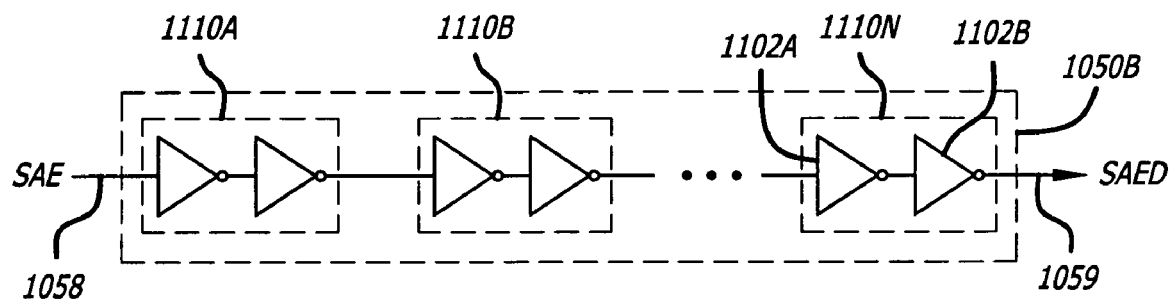
*FIG. 11B*
| Read | BLB value | Sense amp action |
|------|-----------|------------------|
| 1    | 0         | ON               |
| 0    | 1         | OFF              |
*FIG. 12*

LOW POWER DELAY CONTROLLED ZERO SENSITIVE SENSE AMPLIFIER

FIELD

Embodiments of the invention relate generally to static random access memory and cache memory, and specifically to sense amplifiers to read data from memory cells.

BACKGROUND INFORMATION

In portable battery operated electronic equipment, such as laptop computers, power consumption and form factor are important in their design. Microprocessors, memory, and other integrated circuit components are often a part of portable battery operated electronics. Reducing the die-size and power consumption in microprocessors, memory and other integrated circuit components can help to achieve the design goals set for the portable battery operated electronic equipment.

Today's portable battery operated electronic equipment are being asked to operate faster and store more information while providing greater power conservation to extend battery life and the time between battery charging. The design of cache memory and static random access memory (SRAM) in a microprocessor, memory or other integrated circuit component can aid in meeting these goals.

The design of a cache memory to temporarily store information is well known. On-die cache memory within a microprocessor, for example, are constructed using Small Signal Arrays (SSA) that consists of millions of static random access memory (SRAM) cells. A typical SRAM cell consisted of a pair of cross-coupled inverters and a pair of transfer gates or pass transistors. The typical SRAM cell was usually balanced so that it could equally drive and receive logic levels.

With smaller transistors, the static random access memory cell being widely used in today's integrated circuit chips save considerable area by virtue of their smaller cell sizes.

However with the use of smaller transistors, power supply voltages and threshold voltages have been reduced. Because of such small device sizes in the transistors, a SRAM cell when accessed may not have the capability to drive a low or high rail voltage (VSS or VDD) onto a bitline node. This may be due to large numbers of SRAM cells being connected to the same bitline node in the cache memory.

To properly read out data from a SRAM cell, a sense amplifier (also referred to as "sense amp", SA) may be used to overcome the drive limitations of an SRAM cell. The sense amplifier can generally be used to detect a small differential signal developed between a pair of signal lines and amplify it into single output signal with proper logic levels, such as CMOS logic levels.

Typical designs of a cache memory use a pair of bitlines (a positive bitline and a negative or inverted bitline) with opposite logic signals forming a differential signal that is used to read data out from and write data into an SRAM cell. This is sometimes referred to as being a dual ended cache memory design. When reading an SRAM cell, the signals on the pair of bitlines were coupled into the sense amplifier to provide a differential signal. For reliable performance of the SRAM cell, the pair of bit lines are often precharged to a high rail voltage level during a time period when the SRAM cells are not being accessed. When accessed, one of the bitlines (either the positive bitline BL or the negative bitline (BLB, or bitline bar) is discharged during a read or write operation with a SRAM cell. However, precharging both of the pair of bitlines to the high rail voltage consumes power.

In order to conserve power, the SRAM cell has modified to use only a single bitline so that half of the bitlines are precharged in a cache memory design. This is sometimes referred to as being a single ended cache memory design. More recently, an unbalanced asymmetric SRAM cell with dual thresholds has been proposed to reduce leakage currents and power consumption.

BRIEF DESCRIPTION OF THE DRAWINGS

The features of the embodiments of the invention will become apparent from the following detailed description in which:

FIG. 11A illustrates a schematic diagram of one embodiment of a tuned delay circuit.

FIG. 11B illustrates a schematic diagram of another embodiment of a tuned delay circuit.

FIG. 12 illustrates a truth table of the functionality of a delay controlled zero sensitive (DCZS) sense amplifier.

Like reference numbers and designations in the drawings indicate like elements providing similar functionality.

DETAILED DESCRIPTION

Figure 1A:
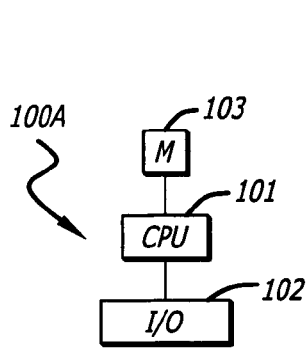
FIG. 1A illustrates a block diagram of a typical computer system in which embodiments of the invention may be utilized.

In the following detailed description of embodiments of the invention, numerous specific details are set forth in order to provide a thorough understanding of the invention. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

The terms high and low are used herein to define voltage levels on a node respectively representing a one or a zero bit. The terms logical one and logical zero are used herein to denote the external data bit irrespective as to whether it is actually a high or low on a given node. A number of inversions may occur that internally changes the polarity of an external data bit from high to low or low to high. Provided that a number of even inversions occur, the polarity of the external data bit will be restored.

The term transfer gate is used herein to refer to a switch with pair of switch terminals or poles and a control terminal to control the open and closing of the switch. The transfer gate may be implemented by any transistor including a p-channel field effect transistor (PFET), an n-channel field effect transistor (NFET), or both NFET and PFET in parallel together. The PFET and the NFET include source and drain terminals similar to the switch terminals or poles and a gate that is similar to the switch control terminal.

Experiments and benchmark traces have shown that the proportion of logical zero and logical one stored in a cache memory is unequal. Experiments suggest that more than seventy-five percent of accesses into a cache memory (data and instruction cache memory) yields a logical zero. That is, a logical zero is more often stored into a memory cell than is a logical one. In a conventional dual-ended design one of the pair of bitlines will be discharged regardless of the data being read out. However in a single-ended design, greater frequency of storing and reading a logical zero may be exploited to reduce power consumption. With proper selection and preconditioning of the single bitline, power consumption can be reduced when reading a logical zero out from a cache memory.

The design of a sense amplifier can also take into consideration the greater frequency of a logical zero being stored and read out from a cache memory. The embodiments of the invention use the greater frequency of a logical zero being written and read from memory to further reduce power consumption. Embodiments of the invention may also use the greater frequency of a logical zero to speed-up read access times In one embodiment of the invention, a Delay Controlled Zero Sensitive (DCZS) sense amplifier is provided that is more sensitive to a logical zero by conserving power by avoiding the complete discharge of an internal node and reducing the delay in reading and resolving the most frequently stored bit. a logical zero.

In another embodiment of the invention an integrated circuit is provided including a sense amplifier to read data from a memory cell that has a first transfer gate, a second transfer gate, a comparator, and a control circuit coupled to the comparator. The first transfer gate has a first pole coupled to a positive power supply. The second transfer gate has a first pole coupled to a bitline of the memory cell. The comparator has a first input coupled to a second pole of the first transfer gate, a second input coupled to a second pole of the second transfer gate, and an output coupled to the second input. The comparator to compare signals on the first input and the second input and to selectively generate a greater differential signal there-between. The control circuit turns off the comparator responsive to a logical zero being read from the memory cell avoiding the generation of the greater differential signal.

In another embodiment of the invention a method is provided that includes addressing a memory cell to read data therein; driving the data in the memory cell onto a bitline; determining if the data in the memory cell is associated with a logical zero; and if the data in the memory cell is associated with a logical zero then driving out a logical zero being read from the memory cell without a comparator evaluating the data on the bitline to conserve power. The method may further include one or more of preconditioning the bitline to a state associated with a logical zero, determining a read access into the memory cell, and isolating the bitline from the comparator in response to a sense enable signal. If the data in the memory cell is associated with a logical one, the method may further include isolating the bitline from the comparator in response to a sense enable signal, turning ON the comparator, and evaluating the signal on the bitline and driving out a logical one is read from the memory cell.

In another embodiment of the invention, a system is provided with a memory that includes one or more memory cells coupled to a bitline, a preconditioner coupled to the bitline, and a sense amplifier coupled to the bitline. The sense amplifier has a first transfer gate, a second transfer gate, a comparator, and a control circuit coupled to the comparator. The first transfer gate has a first pole coupled to a positive power supply. The second transfer gate has a first pole coupled to the bitline. The comparator has a first input coupled to a second pole of the first transfer gate, a second input coupled to a second pole of the second transfer gate. The comparator to selectively compare signals on the first input and the second input and generate a differential signal between the first input and the second input. The control circuit is provided to turn off the comparator in response to a logical zero being read from the memory cell.

In another embodiment of the invention, a sense amplifier is provide that includes a first p-channel field effect transistor (PFET), a second PFET, a controllable comparator, and a control circuit. The first p-channel field effect transistor (PFET) has a source coupled to a positive power supply and a gate coupled to a sense amp enable signal. The first PFET is to selectively provide a comparison voltage to the first input of the controllable comparator. The second PFET has a source coupled to a bitline and a gate coupled to the sense amp enable signal. The second PFET is to selectively provide a signal on the bitline to the second input of the controllable comparator. The controllable comparator has a first input coupled to a drain of the first PFET and a second input coupled to a drain of the second PFET. The controllable comparator to compare signals on the first input and the second input in response to the sense amp enable signal and a control signal. The control circuit has a first input coupled to the second input of the controllable comparator, a second input coupled to a delayed sense amp enable signal, and an output coupled to the controllable comparator. The control circuit to generate the control signal to turn on the controllable comparator in response to a logical one being read from a memory cell and to turn off the controllable comparator in response to a logical zero being read from the memory cell.

Referring now to FIG. 1A, a block diagram of a typical computer system 100 in which embodiments of the invention may be utilized is illustrated. The computer system 100A includes a central processing unit (CPU) 101; input/output devices (I/O) 102 such as keyboard, modem, printer, external storage devices and the like; and monitoring devices (M) 103, such as a CRT or graphics display. The monitoring devices (M) 103 may provide computer information in a human intelligible format such as visual or audio formats. The system 100 may be a number of different electronic systems other than a computer system.

Figure 1B:
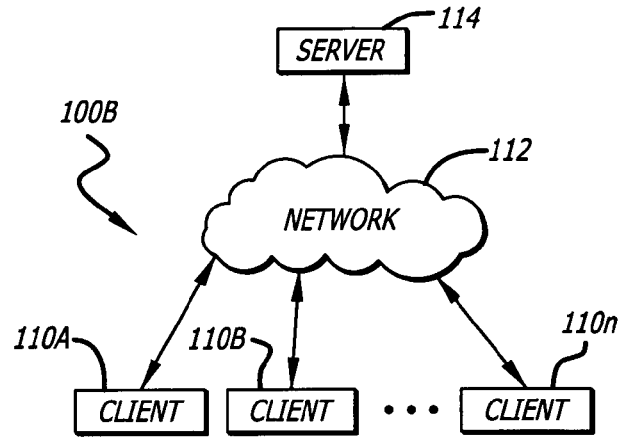
FIG. 1B illustrates a block diagram of a client-server system in which embodiments of the invention may be utilized.

Referring now to FIG. 1B, a client server system 100B in which embodiments of the invention may be utilized is illustrated. The client server system 100B includes one or more clients 110A–110M coupled to a network 112 and a server 114 coupled to the network 112. The clients 110A–110M communicate with the server 114 through the network 112 in order to transmit or receive information and gain access to any database and/or application software that may be needed on the server. The clients 110A–110M and the server 114 may be instances of the typical computer system 100A. The server 114 has a central processing unit with memory and may further include one or more disk drive storage devices. The server 114 may be used in a storage area network (SAN) as a network attached storage (NAS) device, for example, and have an array of disks. The data access to the server 114 is shared over the network 112 with the multiple clients 110A–110C.

Figure 2:
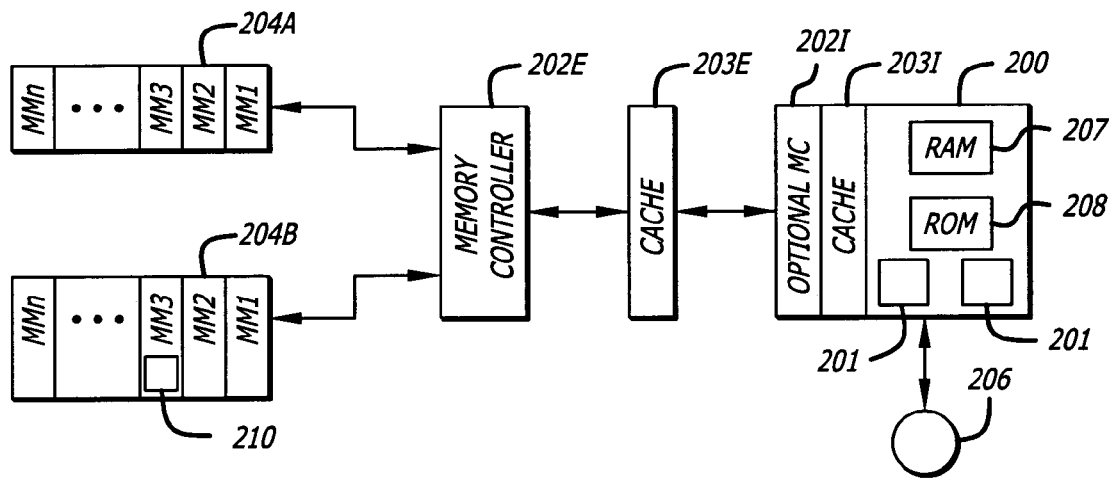
FIG. 2 illustrates a block diagram of a central processing unit in which embodiments of the invention may be utilized.

Referring now to FIG. 2, a block diagram of a central processing unit 101 in which embodiments of the invention may be utilized is illustrated. The central processing unit 101 includes a processor circuit 200 and a memory formed of a first memory 204A of a first memory channel coupled together as shown and illustrated. The memory of the central processing unit 101 may further include a second memory channel with a second memory 204B coupled to the processor circuit 200. The memory 204A,204B includes a memory circuit 210 that may a dynamic random access memory (DRAM) circuit, a static random access memory (SRAM) circuit, or a nonvolatile memory circuit.

The central processing unit 101 may further include an external memory controller 202E and an external cache memory 203E coupled between the processor circuit 200 and the memory 204A,204B. The central processing unit 101 may further include a disk storage device 206 coupled to the processor circuit 200. The disk storage device 206 coupled to the processor circuit 200 may be a floppy disk, zip disk, DVD disk, hard disk, rewritable optical disk, flash memory or other non-volatile storage device.

As illustrated in FIG. 2, the memory controller 202E and the cache memory 203E may be external to the processor circuit 200. In another embodiment, the memory controller may be on-chip or internal to the processor circuit 200, being a part thereof, such as memory controller 202I. The processor circuit 200 may also have one or more of an on-chip or internal cache memory 203I, an on-chip or internal random access memory (RAM) 207, and an on-chip or internal read only memory (ROM) 208.

The processor circuit 200 may further include one or more execution units 201 (also referred to as core processors) and one or more levels of the internal cache memory 203I with or without the external cache memory 203E. Other levels of cache memory may be external to the processor and interface to the memory controller, such as external cache memory 203E. The processor, the one or more execution units, and the one or more levels of cache memory may read or write data (including instructions) through the memory controller with the memory 204A–204B. In interfacing to the memory controller 202I,202E, there may be address, data, control and clocking signals coupled to the memory as part of the memory interface. The processor circuit 200 and the disk storage device 206 may both read and write information into the memory 204A,204B. The memory controller 202E,202I interfaces to each memory 204A–240B to read and write data between the processor circuit 200 and the memory.

Figure 3:
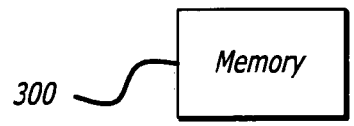
FIG. 3 illustrates a block diagram of a memory that includes a delay controlled zero sensitive (DCZS) sense amplifier.

Referring now to FIG. 3, a block diagram of a memory 300 is illustrated. The memory 300 may be included in the external cache memory 203E, the internal cache memory 203I, the RAM 206, ROM 208, or the memory 210 of the memory modules MM1–MMn in the memories 204A,204B. The memory 300 may also be the ROM 208 with read access only. The memory 300 may be used to store information, such as data and/or instructions. In any case, the memory 300 includes a delay controlled zero sensitive (DCZS) sense amplifier as one embodiment of the invention.

Figure 4:
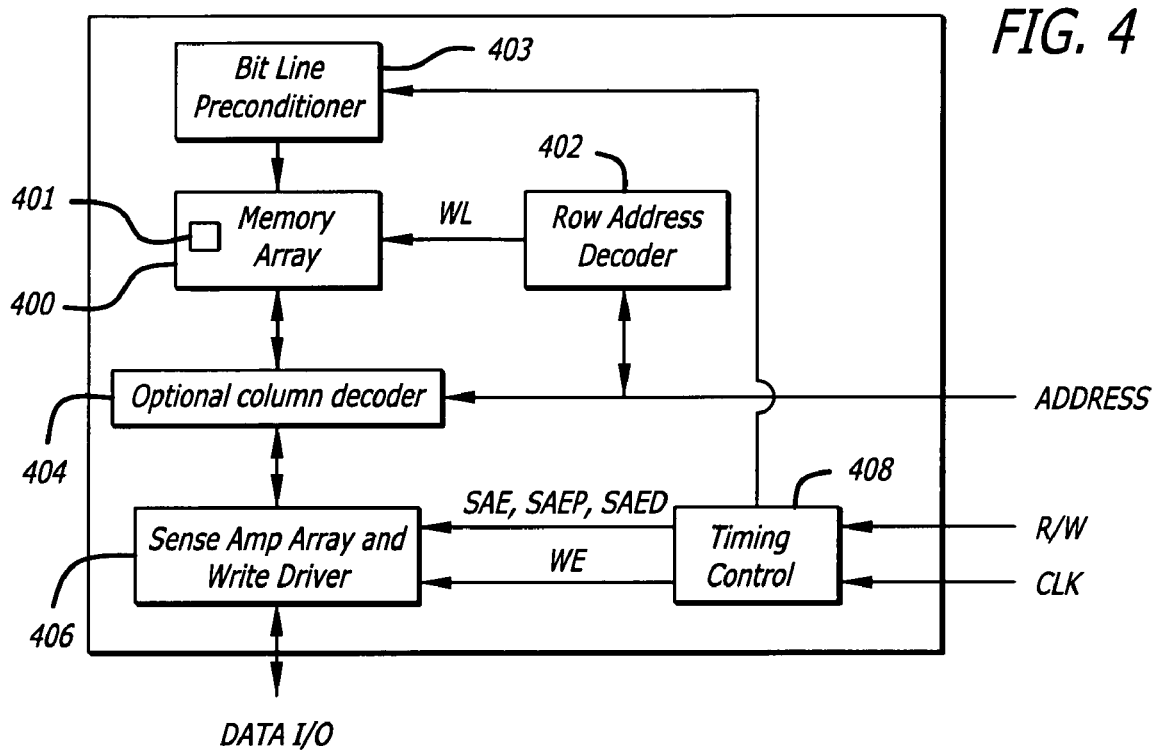
FIG. 4 illustrates a detailed functional block diagram the memory of FIG. 3.

Referring now to FIG. 4, a detailed functional block diagram of the memory 300 is illustrated. The memory 300 includes the memory array 400, a row address decoder 402, a bitline preconditioner 403, an optional column decoder 404, a sense amp array and write driver block 406, and a timing controller 408 coupled together as shown.

The sense amp array and write driver block 406 couples to the data input/output (I/O) bus and may receive control signals from the timing controller 408 such as a write enable (WE) signal, a sense amp enable (SAE) signal, an inverted sense amp enable (SAEP) signal, and a delayed sense amp enable (SAED) signal. The write enable (WE) signal may control the write drivers to write data into the memory array. The sense amp enable (SAE) signal, the inverted sense amp enable (SAEP) signal, and the delayed sense amp enable (SAED) signal may control the sense amplifiers of the sense amplifier array to read data from the memory array. The sense amp array and write driver block 406 receives data to be written into the memory array 400 and drives data out that has been read from the memory array 400 over the data input/output (I/O) bus. The data input/output (I/O) bus may consist of one or more bidirectional data lines for a data word, parity bits, and/or error correction control (ECC) bits.

Figure 5A:
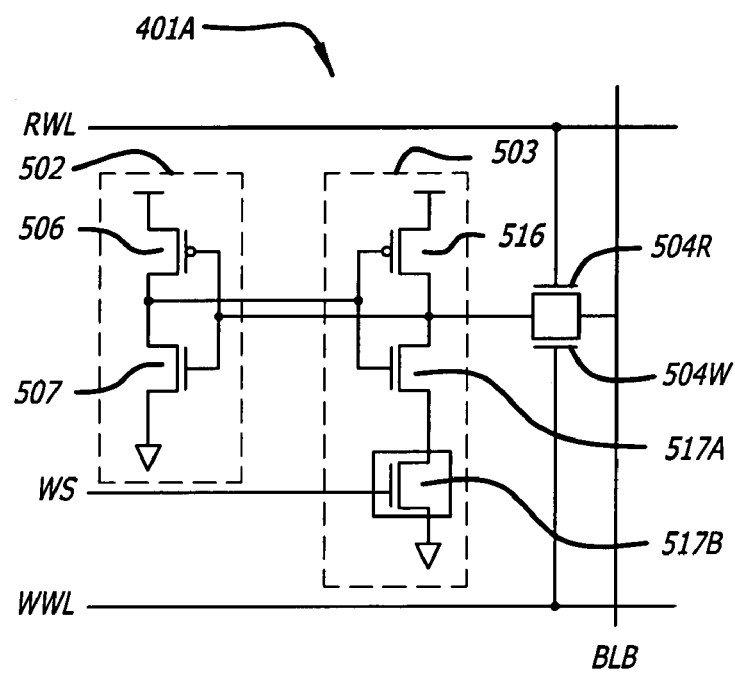
FIG. 5A illustrates a schematic diagram of a single ended static random access memory cell.
Figure 5B:
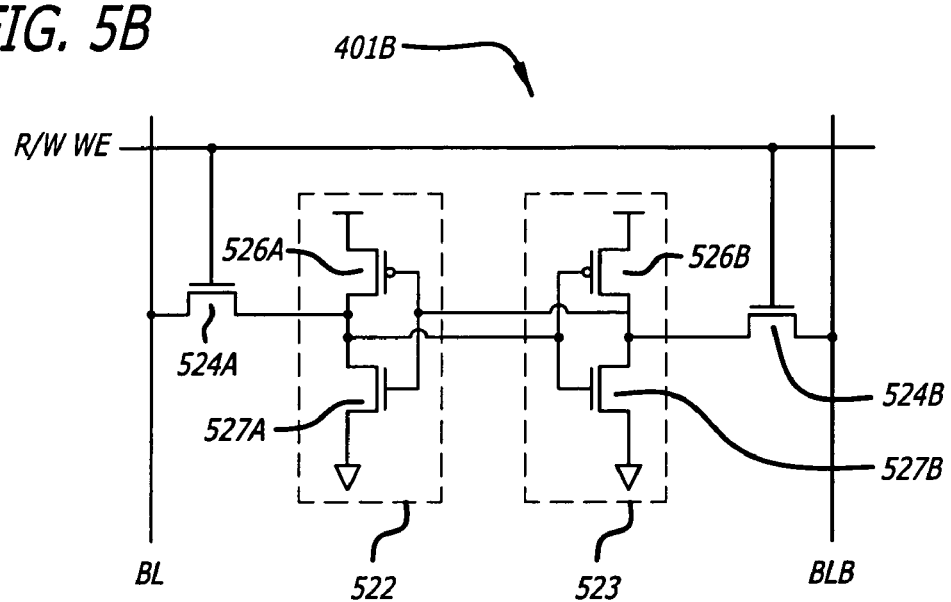
FIG. 5B illustrates a schematic diagram of a double ended static random access memory cell.

The memory array 400 consists of memory cells 401 that may be organized in rows and columns such as an SSA. The memory cells 401 may be dynamic random access memory (DRAM) cells, static random access memory (SRAM) cells, or non-volatile programmable memory cells. FIGS. 5A and 5B illustrate exemplary static random access memory (SRAM) cells that are used in cache memory or static random access memory.

The row address decoder 402 receives an address on the address lines and generates a signal on one of the word lines (WL) in order to address a row of memory cells 401 in the memory array 400. The optional column decoder 404, if present, would also receive the address on the address lines and select which columns within the row of memory cells that are to be accessed. The optional column decoder 404 essentially selects bitlines into memory cells that are to be accessed. In a read access, the optional column decoder 404 functions as a multiplexer. In a write access, the optional column decoder 404 functions as a de-multiplexer.

The sense amplifiers within the sense amp array and write driver block 406 determine whether a logical one or logical zero has been stored within the accessed memory cells during a read operation. The addressed memory cells try to drive a logical one or logical zero onto the selected bitlines of the memory array during the read operation. The sense amplifiers detect whether a logical one or logical zero has been driven out by the addressed memory cells onto the selected bitlines of the memory array during the read operation.

The write drivers within the sense amp array and write driver block 406 may drive a logical one or logical zero onto the selected bitlines of the memory array and into the addressed memory cells during a write operation.

The timing controller 408 may receive a clock (CLK) signal and a read/write (RW) signal in order to generate the memory access control signals including SAE, SAEP, SAED, and WE at the appropriate moments in time. The timing controller 408 may also generate a preconditioning (PREC) signal to control the bitline preconditioner 403.

The bitline preconditioner 403 couples to the bitlines in the memory array 400 in order that they can be preconditioned prior to addressing the memory cells 401 during a read or write operation. The bitline preconditioner 403 preconditions the bitlines in response to the preconditioning (PREC) signal that may be generated by the timing controller 408. The preconditioning (PREC) signal may be a pre-charge signal or a pre-discharge signal having an appropriate polarity depending upon the circuits and type of preconditioning of the bitlines that is used. In one embodiment of the invention, the bitlines are precharged high to a high voltage level close to the positive power supply voltage (VDD) that may represent a level of a logical one. FIGS. 6A, 6B, 7A, and 7B illustrate exemplary pre-charging bitline preconditioners that pre-charge the bitlines to a high voltage level. In another embodiment of the invention, the bitlines may be pre-discharged low to a low voltage level close to the negative power supply voltage (VSS or ground) that may represent a level of a logical zero. FIGS. 6C, 6D, 7C, and 7D illustrate exemplary pre-discharging bitline preconditioners that pre-discharge the bitlines to a low voltage level.

Referring now to FIG. 5A, a schematic diagram of a single ended static random access memory cell 401A is illustrated. Coupled together as shown, the memory cell 401A includes a pair of cross coupled inverters 502–503 and a read/write transfer gate provided by NFETs 504R–504W. The output of inverter 502 is coupled to the input of inverter 503 and the output of inverter 503 is coupled to the input of inverter 502. The transfer gate couples on one side to a bitline (negative bitline BLB) and on the opposite side to the input of inverter 502 and the output of inverter 503. That is the sources of the NFETs 504R–504W are coupled to the bitline while their drains are coupled to the input of inverter 502 and output of inverter 503. The gate of the NFET 504R is coupled to the read word line RWL. The gate of the NFET 504W is coupled to the write word line WWL. The inverter 502 includes a PFET 506 and an NFET 507 coupled together as is well known. The inverter 503 includes a PFET 516 and NFETs 517A–517B with sources and drains coupled in series together between VDD and VSS as is shown. The gate of NFET 517B is coupled to a write sense WS signal. The write sense WS signal is used during a write access into the memory cell 401A.

A single bitline is used to write data into and read data out from the memory cell 401A. The use of single bitline conserves area but more importantly conserves power as only one bitline changes state during access and is preconditioned prior to access.

When the bitline is precondition by precharging, use of the negative bitline BLB can take advantage of the greater frequency of storing logical zero into the memory cell 401A. In which case, the memory cell discharges the negative bitline BLB when its cell contents store a logical one. Thus, the greater frequency of storing logical zero coupled with precharging the negative bitline BLB will statistically cause the negative bitline to discharge and consume power on approximately twenty-five percent of the memory accesses. Thus, power is conserved on approximately seventy-five percent of the memory accesses.

As a single bitline is used with the memory cell 401A, a single ended sense amplifier is used to more rapidly read out the data from the memory cell during a read access.

Referring now to FIG. 5B, a schematic diagram of a double ended static random access memory cell 401B is illustrated. Coupled together as shown, the memory cell 401B includes a pair of cross coupled inverters 522–523, a first transfer gate provided by NFET 524A, and a second transfer gate provided by NFET 524B. The output of inverter 522 is coupled to the input of inverter 523 and the output of inverter 523 is coupled to the input of inverter 522. The first transfer gate couples on one side to a bitline (positive bitline BL) and on the opposite side to the input of inverter 523 and the output of inverter 522. The second transfer gate couples on one side to a bitline (negative bitline BLB) and on the opposite side to the input of inverter 522 and the output of inverter 523. That is, the source of NFET 524A is coupled to the bitline BL while its drain is coupled to the input of inverter 523 and output of inverter 522. The source of NFET 524B is coupled to the bitline BLB while its drain is coupled to the input of inverter 522 and output of inverter 523. The gates of the NFETs 524A–524B are coupled to the read/write wordline (R/W WL). The inverter 522 includes a PFET 526A and an NFET 527A coupled together as is shown and well known. The inverter 523 includes a PFET 526B and an NFET 527B coupled together as is shown and well known.

Two bitlines BL and BLB are used to write data into and read data out from the memory cell 401B. As two bitlines are used, a differential signal can be developed between them during a read access and be evaluated by a double ended sense amplifier.

Referring now to FIGS. 6A–6D, embodiments of a single ended bitline preconditioner are illustrated for use with an array of a single ended memory cell, such as memory cell 401A.

Figure 6A:
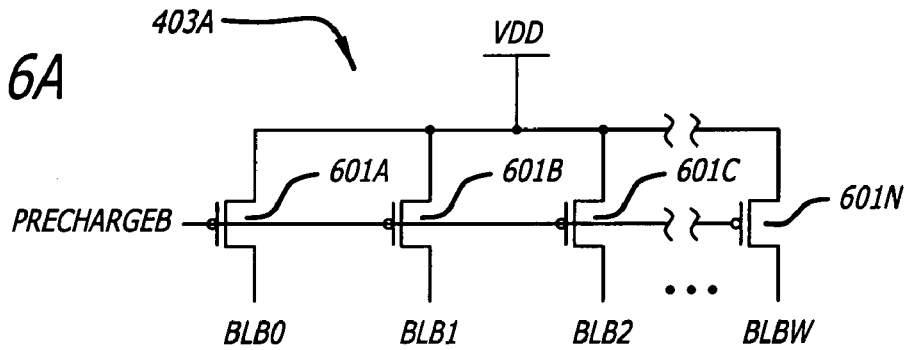
FIG. 6A illustrates a schematic diagram of a single ended pre-charging bitline preconditioner.

In FIG. 6A, a single ended pre-charging bitline preconditioner 403A is illustrated. The bitline preconditioner 403A precharges the bitlines BLB0–BLBN to a high level by coupling them to a positive power supply such as VDD. The bitline preconditioner 403A includes PFETs 601A–601N each having a gate coupled to a PrechargeB control signal, each having a source coupled to VDD, and each having a drain coupled to a respective one of the bitlines BLB0–BLBN in the memory array. With the PrechargeB control signal active low, the PFETs 601A–601N are all turned ON to pull up each one of the bitlines BLB0–BLBN to a high level. When PrechargeB control signal goes high, the PFETs 601A–601N are all turned OFF so that a memory cell can be accessed over the bitlines.

Figure 6B:
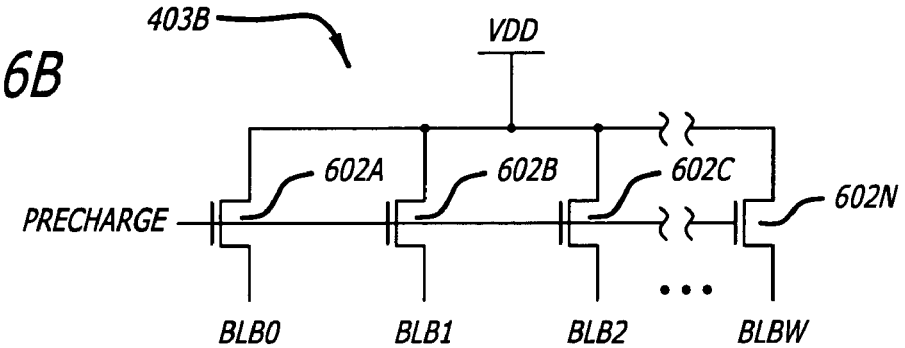
FIG. 6B illustrates another schematic diagram of a single ended pre-charging bitline preconditioner.

In FIG. 6B, a single ended pre-charging bitline preconditioner 403B is illustrated. The bitline preconditioner 403B precharges the bitlines BLB0–BLBN to a high level by pulling them up to within a threshold voltage of the positive power supply VDD. The bitline preconditioner 403B includes NFETs 602A–602N each having a gate coupled to a Precharge control signal, each having a drain coupled to VDD, and each having a source coupled to a respective one of the bitlines BLB0–BLBN in the memory array. With the Precharge control signal active high, the NFETs 602A–602N are all turned ON to pull up each one of the bitlines BLB0–BLBN up towards a high level. When Precharge control signal goes low, the NFETs 602A–602N are all turned OFF so that a memory cell can be accessed over the bitlines.

Figure 6C:
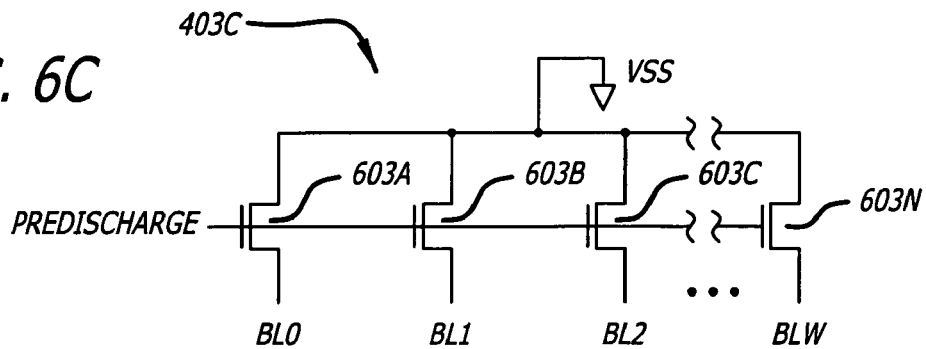
FIG. 6C illustrates a schematic diagram of a single ended pre-discharging bitline preconditioner.

In FIG. 6C, a single ended pre-discharging bitline preconditioner 403C is illustrated. The bitline preconditioner 403C pre-discharges the bitlines BL0–BLN to a low level by pulling them down to the negative power supply voltage VSS or ground GND. The bitline preconditioner 403C includes NFETs 603A–603N each having a gate coupled to a Predischarge control signal, each having a source coupled to VSS, and each having a drain coupled to a respective one of the bitlines BLB0–BLBN in the memory array. With the Predischarge control signal active high, the NFETs 603A–603N are all turned ON to pull down each one of the bitlines BLB0–BLBN towards a low level. When the Predischarge control signal goes low, the NFETs 603A–603N are all turned OFF so that a memory cell can be accessed over the bitlines.

Figure 6D:
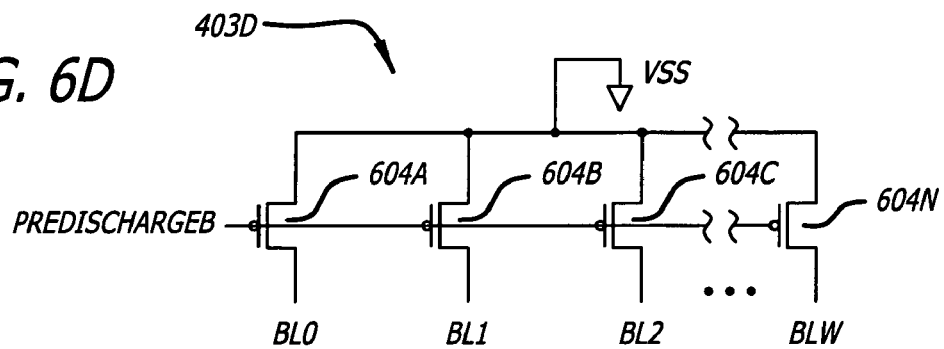
FIG. 6D illustrates another schematic diagram of a single ended pre-discharging bitline preconditioner.

In FIG. 6D, a single ended pre-discharging bitline preconditioner 403D is illustrated. The bitline preconditioner 403D pre-discharges the bitlines BL0–BLN to within a threshold voltage of the negative power supply voltage VSS or ground GND. The bitline preconditioner 403D includes PFETs 604A–604N each having a gate coupled to a PredischargeB control signal, each having a drain coupled to VSS, and each having a source coupled to a respective one of the bitlines BLB0–BLBN in the memory array. With the PredischargeB control signal active low, the PFETs 604A–604N are all turned ON to pull down each one of the bitlines BLB0–BLBN towards a low level. When the PredischargeB control signal goes high, the PFETs 604A–604N are all turned OFF so that a memory cell can be accessed over the bitlines.

Referring now to FIGS. 7A–7D, embodiments of a double ended bitline preconditioner are illustrated for use with an array of a single ended memory cell, such as memory cell 401B.

Figure 7A:
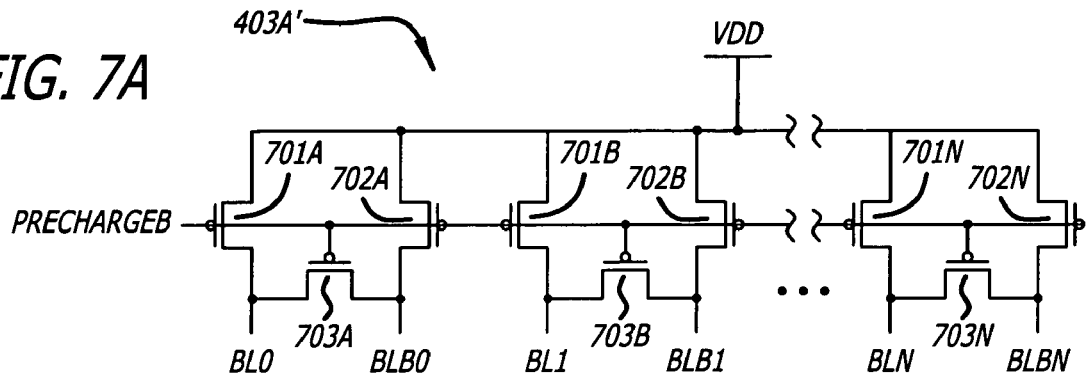
FIG. 7A illustrates a schematic diagram of a double ended pre-charging bitline preconditioner.

In FIG. 7A, a double ended pre-charging bitline preconditioner 403A' is illustrated. The bitline preconditioner 403A' equalizes and precharges both the negative bitlines BLB0–BLBN and the positive bitlines BL0–BLN to a high level by coupling them to a positive power supply such as VDD. The bitline preconditioner 403A' includes PFETs 701A–701N,702A–702N,703A–703N coupled together as shown. PFETs 701A–701N and 702A–702N each have a gate coupled to a PrechargeB control signal, each have a source coupled to VDD, and each respectively have a drain coupled to a respective one of the positive bitlines BL0–BLN and negative bitlines BLB0–BLBN in the memory array. PFETs 703A–703N each have a gate coupled to the PrechargeB control signal, each have a source coupled to a respective one of the positive bitlines BL0–BLN and a drain coupled to a respective one of the negative bitlines BLB0–BLBN.

With the PrechargeB control signal active low, the PFETS 703A–703N equalize the positive bitlines and the negative bitlines by coupling them together and the PFETs 701A–701N,702A–702N are all turned ON to pull up each one of the bitlines BLB–BLN, BLB0–BLBN to a high level. When PrechargeB control signal goes high, the PFETs 701A–701N,702A–702N,703A–703N are all turned OFF so that a memory cell can be accessed over the bitlines.

Figure 7B:
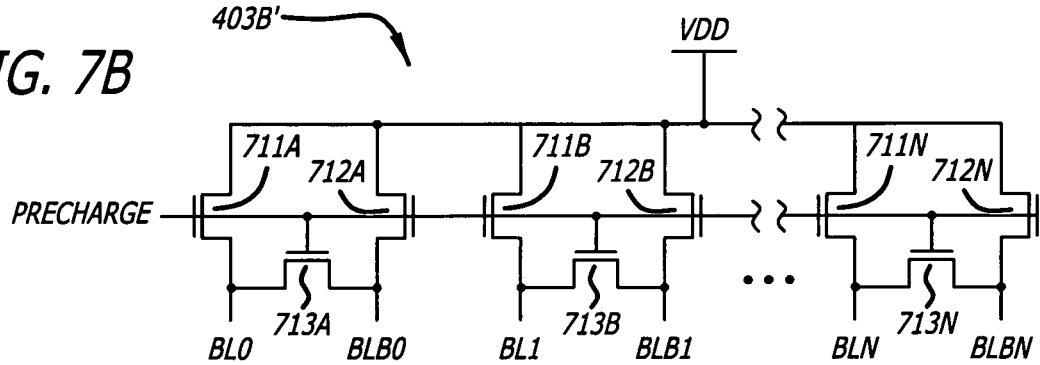
FIG. 7B illustrates another schematic diagram of a double ended pre-charging bitline preconditioner.

In FIG. 7B, a double ended pre-charging bitline preconditioner 403B' is illustrated. The bitline preconditioner 403B' equalizes and precharges both the negative bitlines BLB0–BLBN and the positive bitlines BL0–BLN to a high level by pulling them up within a threshold level of the positive power supply such as VDD. The bitline preconditioner 403B' includes NFETs 711A–711N,712A–712N, 713A–713N coupled together as shown. NFETs 711A–711N and 712A–712N each have a gate coupled to a Precharge control signal, each have a source coupled to VSS and each respectively have a drain coupled to a respective one of the positive bitlines BL0–BLN and negative bitlines BLB0–BLBN in the memory array. NFETs 713A–713N each have a gate coupled to the Precharge control signal, each have a source coupled to a respective one of the positive bitlines BL0–BLN and a drain coupled to a respective one of the negative bitlines BLB0–BLBN.

With the Precharge control signal active high, the NFETS 703A–703N are turned ON to equalize the positive bitlines and the negative bitlines by coupling them together and the NFETs 701A–701N,702A–702N are all turned ON to pull up each one of the bitlines BLB–BLN, BLB0–BLBN to a high level. When Precharge control signal goes low, the NFETs 701A–701N,702A–702N,703A–703N are all turned OFF so that a memory cell can be accessed over the bitlines.

Figure 7C:
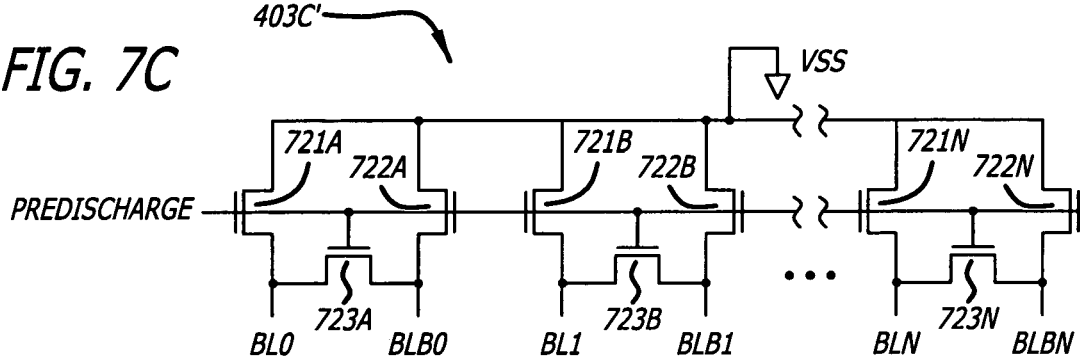
FIG. 7C illustrates a schematic diagram of a double ended pre-discharging bitline preconditioner.

In FIG. 7C, a double ended pre-discharging bitline preconditioner 403C' is illustrated. The bitline preconditioner 403C' equalizes and precharges both the negative bitlines BLB0–BLBN and the positive bitlines BL0–BLN to a low level by pulling them down to the level of the negative power supply such as VSS or GND. The bitline preconditioner 403C' includes NFETs 721A–721N,722A–722N, 723A–723N coupled together as shown. NFETs 721A–721N and 722A–722N each have a gate coupled to a Predischarge control signal, each have a source coupled to VSS and each respectively have a drain coupled to a respective one of the positive bitlines BL0–BLN and negative bitlines BLB0–BLBN in the memory array. NFETs 723A–723N each have a gate coupled to the Predischarge control signal, each have a source coupled to a respective one of the positive bitlines BL0–BLN and a drain coupled to a respective one of the negative bitlines BLB0–BLBN.

With the Predischarge control signal active high, the NFETS 723A–723N are turned ON to equalize the positive bitlines and the negative bitlines by coupling them together and the NFETs 721A–721N,722A–722N are all turned ON to pull down on each one of the bitlines BLB–BLN, BLB0–BLBN to a low level. When the Predischarge control signal goes low, the NFETs 721A–721N,722A–722N, 723A–723N are all turned OFF so that a memory cell can be accessed over the bitlines.

Figure 7D:
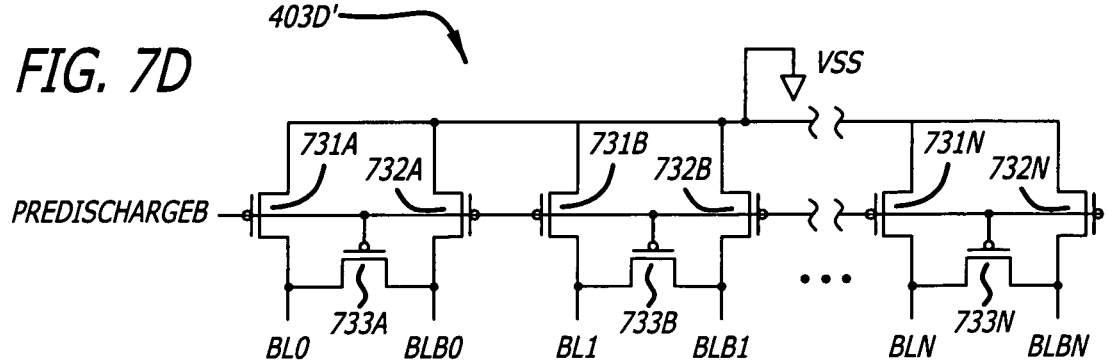
FIG. 7D illustrates another schematic diagram of a double ended pre-discharging bitline preconditioner.

In FIG. 7D, a double ended pre-discharging bitline preconditioner 403D' is illustrated. The bitline preconditioner 403D' equalizes and precharges both the negative bitlines BLB0–BLBN and the positive bitlines BL0–BLN to a low level by pulling them down to the level of the negative power supply such as VSS or GND.

The bitline preconditioner 403D' includes PFETs 731A–731N,732A–732N,733A–733N coupled together as shown. PFETs 731A–731N and 732A–732N each have a gate coupled to a PredischargeB control signal, each have a drain coupled to VSS, and each respectively have a source coupled to a respective one of the positive bitlines BL0–BLN and negative bitlines BLB0–BLBN in the memory array. PFETs 733A–733N each have a gate coupled to the PredischargeB control signal, each have a source coupled to a respective one of the positive bitlines BL0–BLN and a drain coupled to a respective one of the negative bitlines BLB0–BLBN.

With the PredischargeB control signal active low, the PFETS 733A–733N equalize the positive bitlines and the negative bitlines by coupling them together and the PFETs 731A–731N,732A–732N are all turned ON to pull down on each one of the bitlines BLB–BLN, BLB0–BLBN to within a threshold level of VSS. When PredischargeB control signal goes high, the PFETs 731A–731N,732A–732N, 733A–733N are all turned OFF so that a memory cell can be accessed over the bitlines.

Figure 8:
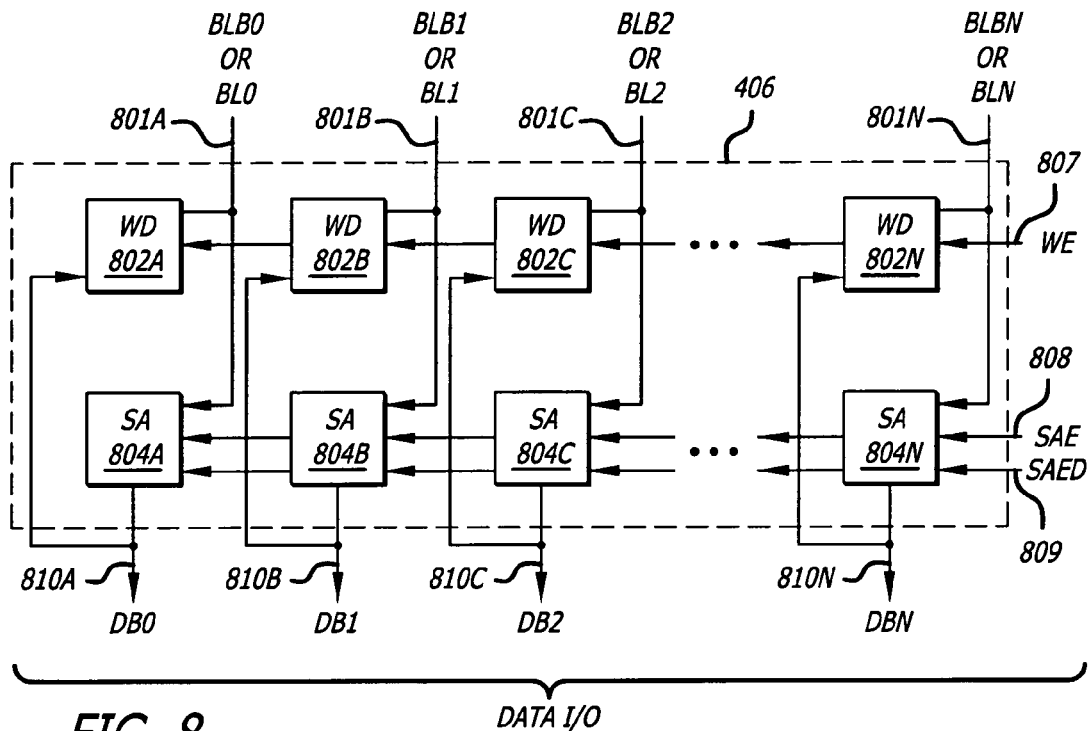
FIG. 8 illustrates a detailed functional block diagram of the sense amplifier array and write driver of FIG. 4.

Referring now to FIG. 8, a functional block diagram of the sense amp array and write driver block 406 is illustrated. The WE signal 807, the SAE signal 808, and the SAED signal 809 are coupled into the sense amp array and write driver block 406 to control the writing of data into and the reading of data from the memory array. The SAEP signal may also be coupled into the sense amp array and write driver block 406 to further control the reading of data from the memory array. The sense amp array and write driver block 406 includes N write drivers (WD) 802A–802B and N sense amplifiers (SA) 804A–804N coupled together as shown in FIG. 8. The SAE signal 808 and the SAED signal 809 are coupled into each of the sense amplifiers 804A–804N. The SAEP signal may also be coupled into each of the sense amplifiers 804A–804N in other embodiments of the invention. The WE signal 807 may be coupled into each of the write drivers 802A–802N.

In FIG. 8 and other figures that follow, positive bit lines for the memory cells are labeled BL0 through BLN (generally referenced as BL) and negative bit lines for the memory cells are labeled BLB0 through BLBN (generally referenced as BLB). As discussed previously, the optional column decoder 404 may actually multiplex bitlines of the memory array into the sense amplifiers 804A–804N. The optional column decoder 404 may actually demultiplex each output of the write drivers 802A–802N into bitlines of the memory array. In the case of a single ended system, the optional column decoder 404 may couple to either the positive bit lines (BL0–BLN) or the negative bit lines (BLB0–BLBN) 801A–801N of each of the columns of memory cells within the memory array 200. In the case of a doubled ended system, the optional column decoder 404 may couple to either the positive bit lines (BL0–BLN) or the negative bit lines (BLB0–BLBN) 801A–801N of each of the columns of memory cells within the memory array 200 in one embodiment of the invention. In another case of a doubled ended system, the optional column decoder 404 may couple to both the positive bit lines (BL0–BLN) and the negative bit lines (BLB0–BLBN) 801A–801N of each of the columns of memory cells within the memory array 200 in one embodiment of the invention.

In the case of a single ended system, the write drivers 802A–802N and the sense amplifiers 804A–804N may both couple to either the positive bit lines (BL0–BLN) or the negative bit lines (BLB0–BLBN) 801A–801N of each of the columns of memory cells within the memory array 200 as illustrated in FIG. 8. In the case of a double ended system, the sense amplifiers 804A–804N may not couple to both the positive bit lines (BL0–BLN) and the negative bit lines (BLB0–BLBN) 801A–801N of each of the columns of memory cells within the memory array 200, leaving one of the positive or negative bit lines unconnected in one embodiment of the invention. In another case of a double ended system, the sense amplifiers 804A–804N may couple to both the positive bit lines (BL0–BLN) and the negative bit lines (BLB0–BLBN) 801A–801B of each of the columns of memory cells within the memory array 200, in another embodiment of the invention. Both the write drivers 802A–802N and the sense amplifiers 804A–804N couple to the respective data bits DB0–DBN 810A–810N of the data I/O bus. In any case, a sense amplifier is coupled to at least one of the bit lines (positive BL0–BLN or negative BLB0–BLBN bitlines 801A–801N) during a read access in order to be able to receive a signal from a memory cell.

Figure 9A:
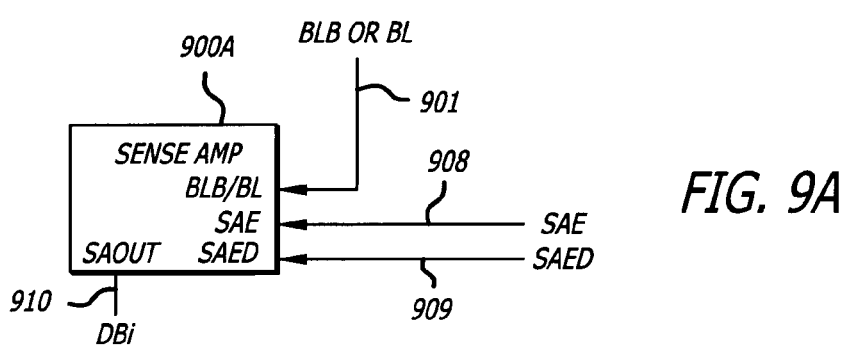
FIG. 9A illustrates a block diagram of a singled ended sense amplifier for the sense amplifier array and write driver of FIG. 6.

Referring now to FIG. 9A, a block diagram of a sense amplifier 900A is illustrated. The sense amp 900A is a single ended sense amplifier and receives either the positive bit line BL or the negative bit line BLB 901 as its data input to generate a data bit output DBi 910 during a read access. The sense amplifier 900A receives the SAE signal 908 and the SAED signal 909 to appropriate evaluate the data stored in a memory cell. The sense amplifier 900A may also receive the SAEP signal to appropriate evaluate the data stored in a memory cell.

Figure 9B:
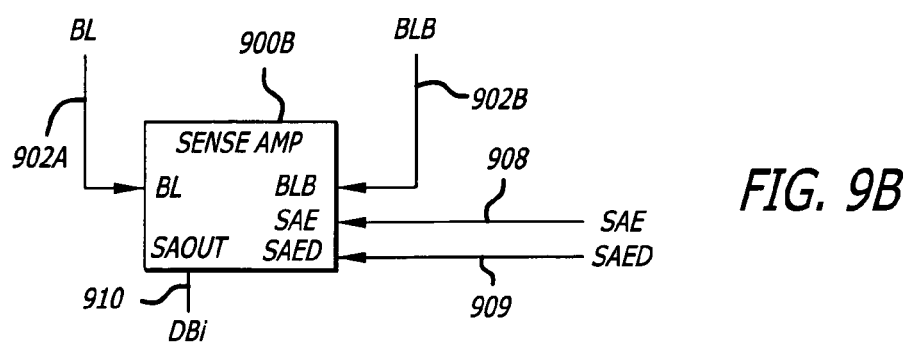
FIG. 9B illustrates a block diagram of a double ended sense amplifier.

Referring now to FIG. 9B, a block diagram of a sense amplifier 900B is illustrated. The sense amp 900B is a doubled ended sense amplifier and receives both the positive bit line BL 902A and the negative bit line BLB 902B as its data inputs to generate the data bit output DBi 910 during a read access. The sense amplifier 900B receives the SAE signal 908 and the SAED signal 909 to appropriate evaluate the data stored in a memory cell. The sense amplifier 900B may also receive the SAEP signal to appropriate evaluate the data stored in a memory cell.

Referring momentary to FIG. 12, a truth table of the functionality of a sense amplifier is illustrated. Generally during the reading of a logical zero, the negative bitline (BLB or bitline bar) is a one value so that the sense amplifier can be turned OFF.

Referring back now to FIGS. 9A–9B, during the preconditioning of the bitlines, the sense amplifiers 900A and 900B are set to sample the respective bitline 901 or bitlines 902A–902B and initialized so that they are preconditioned to generate a logical zero output, without changing state. That is, the sense amplifiers 900A–900B are biased and ready to indicate at their outputs that a logical zero was stored in a memory cell. In this manner, power is conserved as a logical zero is more frequently stored into the memory cell. During a memory read access of a logical zero from a memory cell, control circuitry in the sense amplifiers 900A–900B maintain the indication at their outputs that a logical zero was stored in the memory cell. At the same time, control circuitry decouples the sense amplifiers 900A–900B from their respective bitline 901 or bitlines 902A–902B and further turns OFF a comparator that is used to sense the signal or signals on the bitlines. In this manner, less circuitry in the sense amplifiers 900A–900B change state when they have been biased to a logical zero state.

If a logical one is stored in the memory cell, the sense amplifiers 900A–900B will change from their initialized state (generating a logical zero indication) during the read access. During a memory read access of a logical one, the sense amplifier 900A acts as a comparator and compares the signal on either the positive bit line BL or the negative bit line BLB 901 with an internally provided voltage level. During a memory read access of a logical one, the sense amplifier 900B acts as a comparator and compares the signals on the positive bit line BL 902A and the negative bit line BLB 902B against each other. The control circuitry in the sense amplifiers 900A–900B keep the comparator turn ON that is used to sense the signal or signals on the bitlines. The sense amplifiers 900A–900B determine from the signal on the bitlines that a logical one is stored in the memory cell and so indicate at their outputs.

Figure 10A:
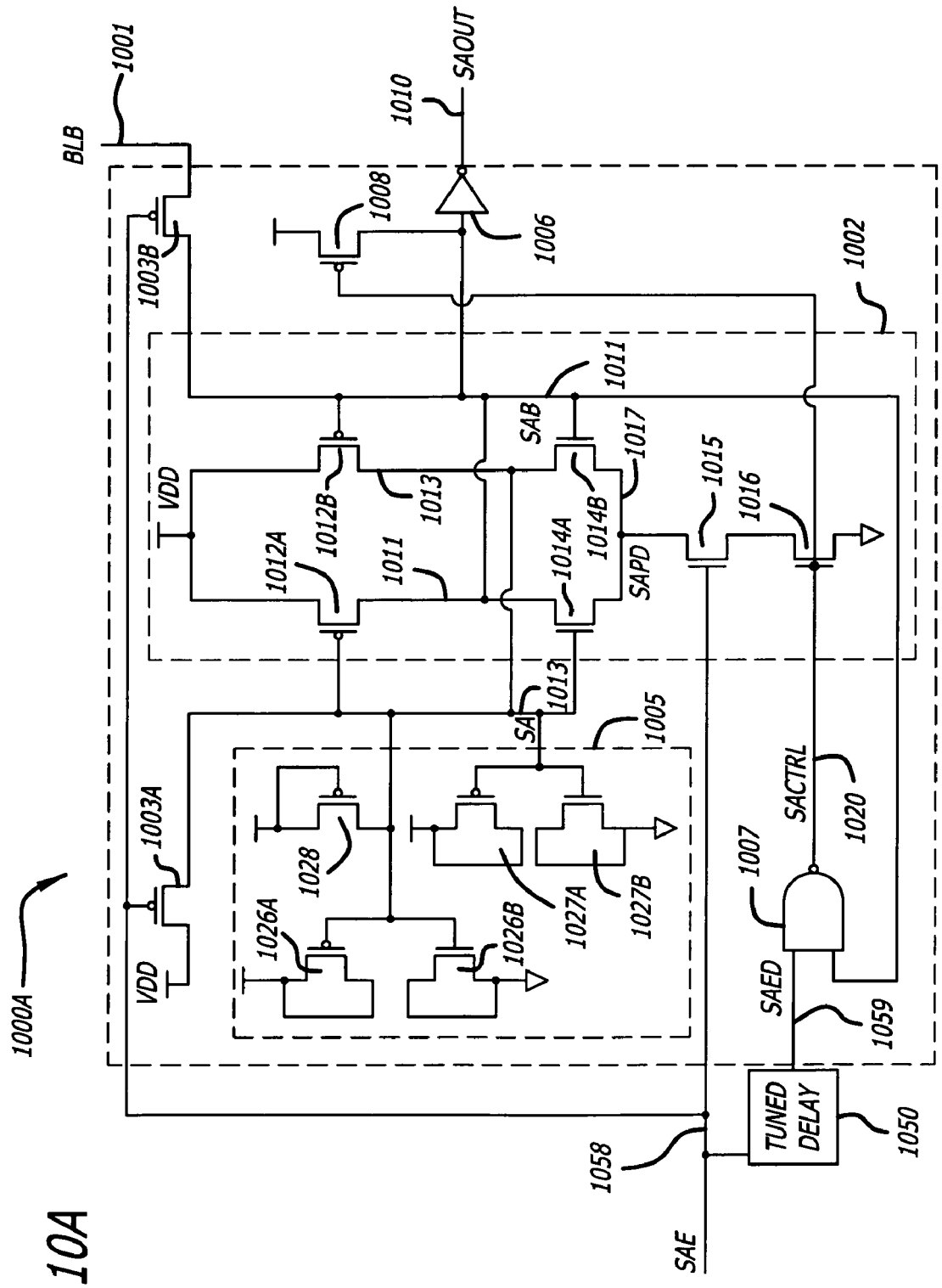
FIG. 10A illustrates a schematic diagram of one embodiment of the invention for a delay controlled zero sensitive (DCZS) sense amplifier.
Figure 10B:
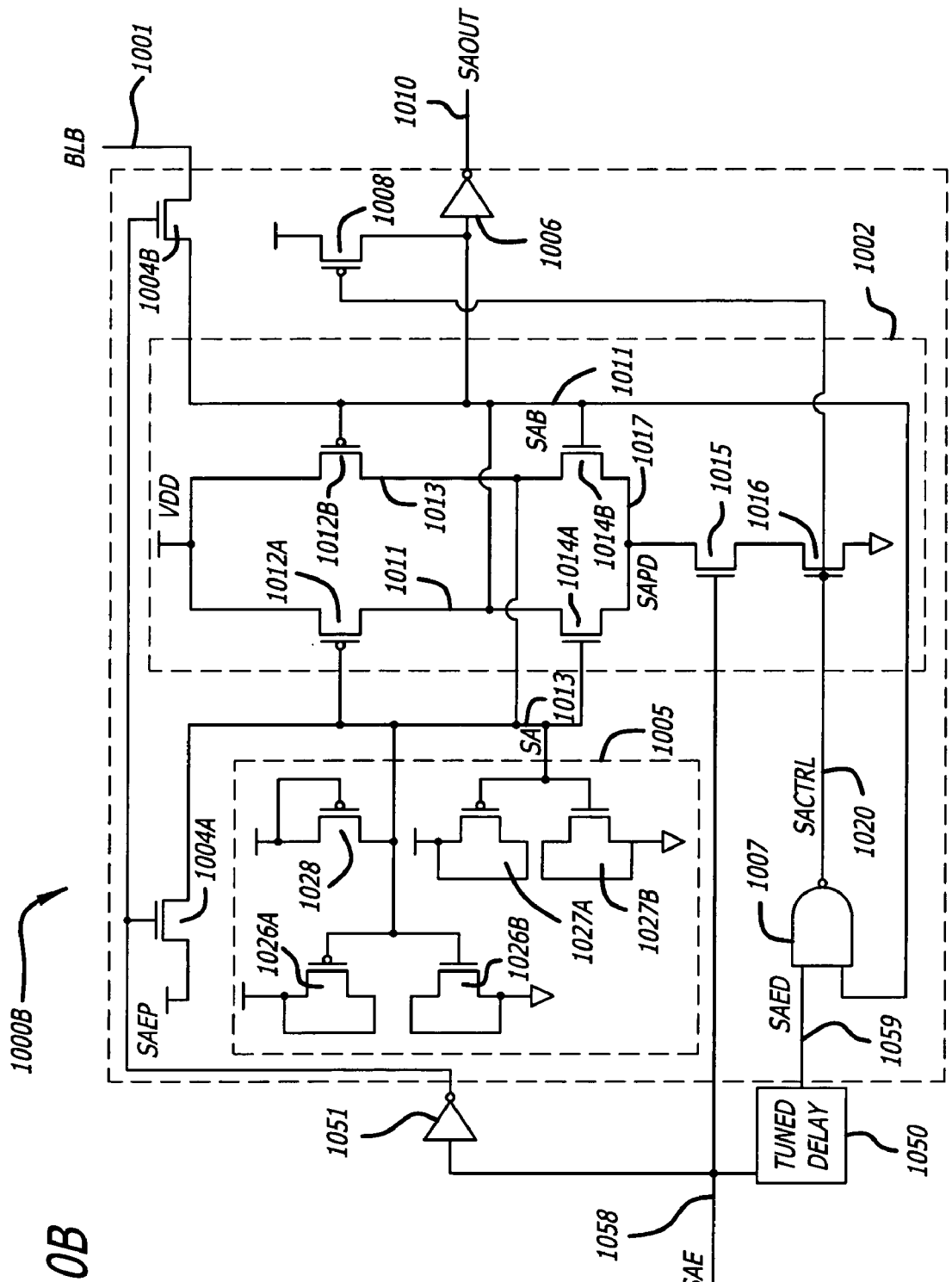
FIG. 10B illustrates a schematic diagram of another embodiment of the invention for a delay controlled zero sensitive (DCZS) sense amplifier.
Figure 10C:
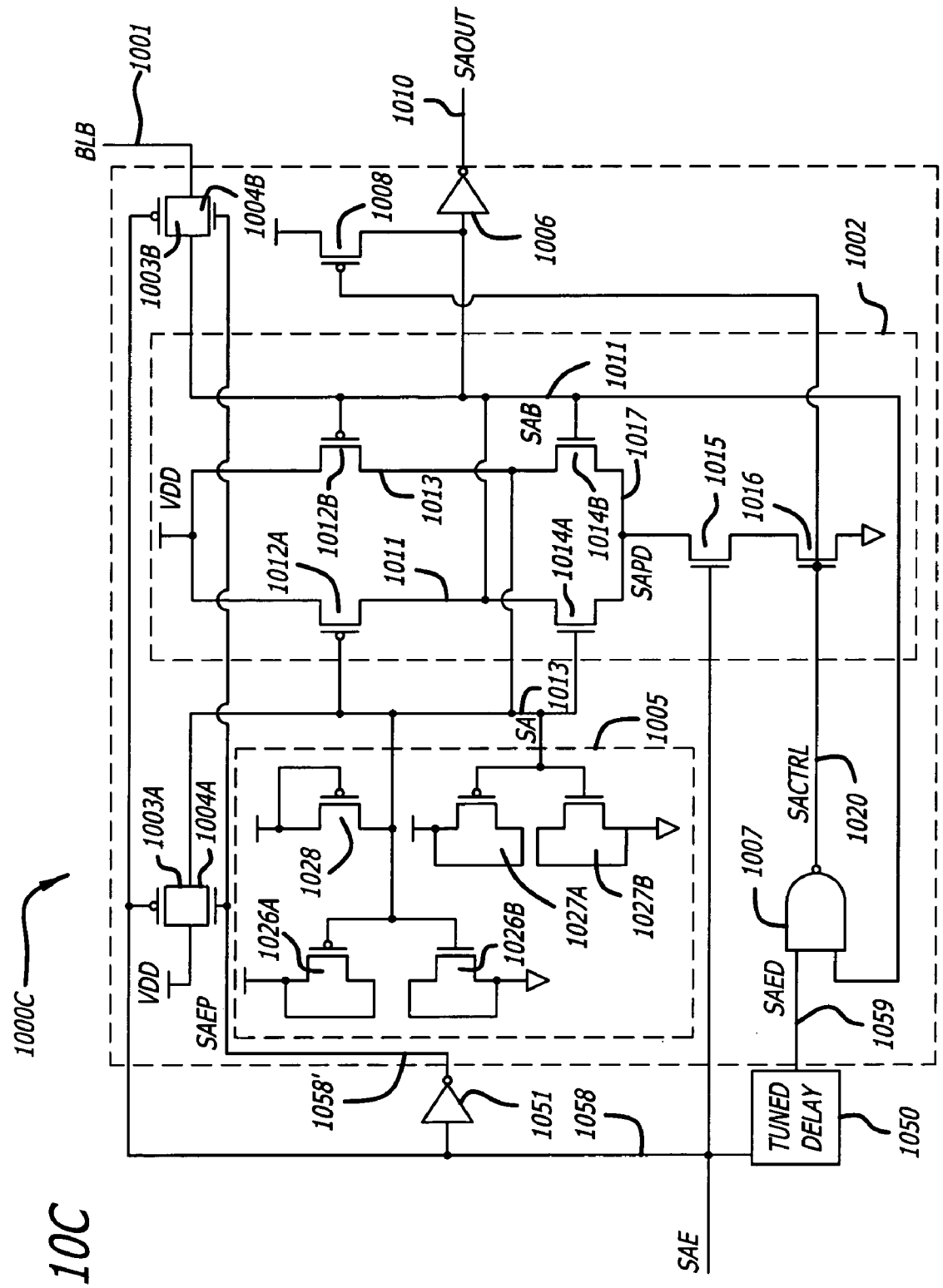
FIG. 10C illustrates a schematic diagram of another embodiment of the invention for a delay controlled zero sensitive (DCZS) sense amplifier.
Figure 10D:
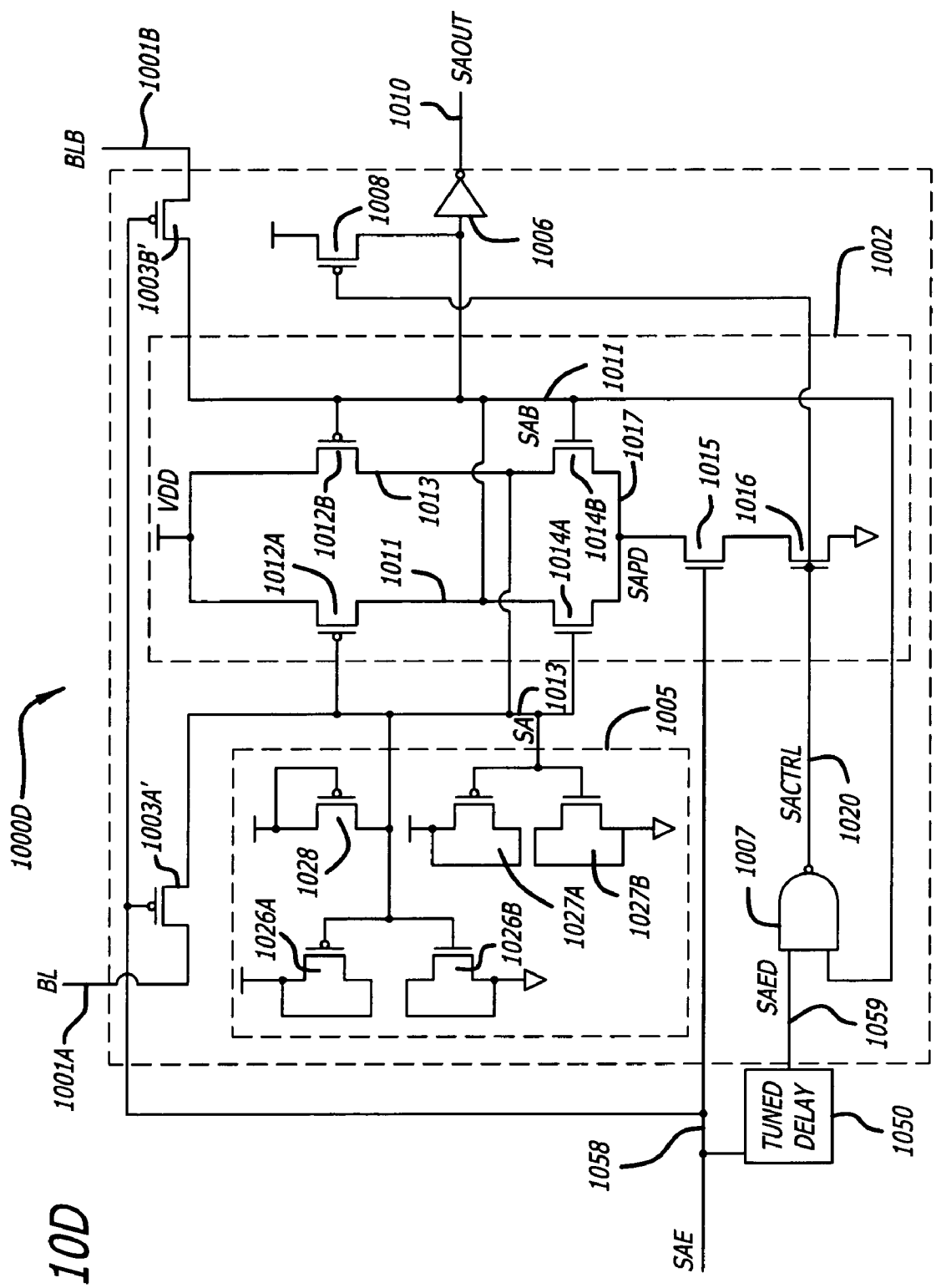
FIG. 10D illustrates a schematic diagram of another embodiment of the invention for a delay controlled zero sensitive (DCZS) sense amplifier.

Referring now to FIGS. 10A–10D schematic diagrams of embodiments of the invention for a delay controlled zero sensitive (DCZS) sense amplifier are illustrated. The delay controlled zero sensitive (DCZS) sense amplifiers 1000A, 1000B, and 1000C respectively illustrated in FIGS. 10A–10C are single ended sense amplifiers representing instances of the sense amplifier 900A of FIG. 9A. The delay controlled zero sensitive (DCZS) sense amplifier 1000D illustrated in FIG. 10D is a double ended sense amplifier representing an instance of the sense amplifier 900B of FIG. 9B.

Each of the sense amplifiers 1000A–1000D have a comparator that can be selectively turned ON in response to reading a logical one from a memory cell and selectively turned OFF in response to reading a logical zero from the memory cell. When turned ON, the comparator compares signals at its inputs and generates a larger differential signal there-between. When turned OFF, the comparator avoids generating a larger differential signal between its inputs. As the comparator is selectively controlled to be turned ON and OFF it may also be referred to as a controllable comparator.

In FIG. 10A, a delay controlled zero sensitive (DCZS) sense amplifier 1000A is illustrated coupled to a tuned delay 1050. The signal generated by the tuned delay 1050 may be globally used by all the sense amplifiers for each data bit output desired as part of the timing control block 408 in one embodiment of the invention. That is, the tuned delay circuit 1050 may be part of the global control circuitry for the memory. In another embodiment of the invention, the tuned delay 1050 may be provided for each sense amplifier as a part thereof with only the SAE signal being globally provided to each sense amplifier.

Coupled together as shown, the sense amplifier 1000A includes a comparator 1002, a first transfer gate provided by PFET 1003A, a second transfer gate provided by PFET 1003B, a balancing circuit 1005, an inverter or buffer 1006, and a control circuit provided by a NAND gate 1007 and a pull-up transistor, PFET 1008. The comparator 1002 receives signals on the SA node 1011 and the SAB node 1013 for comparing. The balancing circuitry 1005 is coupled to the SA node 1011 for providing a balanced load on the comparator inputs, the SA node 1011 and the SAB node 1013.

The comparator 1002 includes PFETS 1012A–1012B and NFETS 1014A–1014B coupled in parallel to each other as shown, and NFETS 1015–1016 coupled in series as shown. The sources of PFETS 1012A–1012B are coupled to the positive power supply VDD, the gates of PFETS 1012A–1012B are respectively coupled to the SA node 1013 and the SAB node 1011, while the drains of PFETS 1012A–1012B are respectively coupled to SAB node 1011 and SA node 1013. The sources of NFETS 1014A–1014B are coupled to the sense amp pull down (SAPD) node 1017, the gates of NFETS 1014A–1014B are respectively coupled to the SA node 1013 and the SAB node 1011, while the drains of NFETS 1014A–1014B are respectively coupled to the SAB node 1011 and the SA node 1013. The source of NFET 1016 is coupled to the negative power supply VSS or ground (GND), the gate of NFET 1016 is coupled to the sense amp control (SACTRL) signal 1020, and the drain of NFET 1016 is coupled to the source of NFET 1015. The source of NFET 1015 is coupled to the drain of NFET 1016, the gate of NFET 1015 is coupled to the sense amp enable (SAE) signal 1058, and the drain of NFET 1015 is coupled to the SAPD node 1017.

The balancing circuit 1005 includes dummy transistors that mirror the transistor loading found on the SAB node 1011. The balancing circuit 1005 includes PFET 1026A and NFET 1026B to mirror the load of the inverter 1006. The balancing circuit 1005 further includes PFET 1027A and NFET 1027A to mirror the load of the NAND gate 1007. The balancing circuit 1005 further includes PFET 1028 to mirror the load of the pull-up PFET 1008.

The dummy transistors of the balancing circuit 1005 are coupled to the SA node 1013 so that the comparator of the sense amplifier experiences similar parasitic capacitive loads at its inputs, the SA node 1013 and the SAB node 1011. The source and drain of the PFETs 1026A,1027A are coupled together to VDD and the gate of PFETs 1026A, 1027A is coupled to the SA node 1013. The source and drain of the NFETs 1026B,1027B, are coupled together to VSS and the gate of NFETs 1026B,1027B is coupled to the SA node 1013. The source and gate of PFET 1028 are coupled together to VDD and the drain of PFET 1028 is coupled to the SA node 1013.

The first transfer gate is provided by PFET 1003A. The source, gate, and drain of PFET 1003A are respectively coupled to VDD, the SAE signal 1058, and the SA node 1013. As the sense amplifier is single ended, the first transfer gate balances the load and the initial voltage applied to the SA node 1013, mirroring what is initially seen by the SAB node 1011. The first transfer gate also sets the comparison voltage used by the comparator 1005 to compare with the signal on the bitline 1001.

The second transfer gate is provided by PFET 1003B. The source, gate, and drain of PFET 1003B are respectively coupled to BL# or BLB 1001, the SAE signal 1058, and the SAB node 1011. The second transfer gate couples the signal on the bitline 1001 into the sense amplifier 1000C when SAE signal 1058 is low and disabling the sense amplifier. The second transfer gate decouples the signal on the bitline 1001 from the sense amplifier 1000C when SAE signal 1058 is high and enabling the sense amplifier.

When the SAE signal is high, the PFETs 1003A–1003B are turned OFF and the first and second transfer gates are open. When the SAE signal is low, the PFETs 1003A–1003B are turned ON and the first and second transfer gates are closed to transfer charges.

In FIG. 10A, the second transfer gate (PFET 1003B) functions as both as a transfer gate when turned ON and an isolation device to isolate any load on the BLB bitline 1001 from the sense amp 1000A after being turned OFF. On the other hand, the first transfer gate (PFET 1003A) is used to provide the comparison voltage on the SA node 1013 when turned ON and balance out the load of the PFET 1003B as seen by the comparator 1002 when turned OFF.

During a read access, the SAE signal is initially low allowing a period of time for a memory cell to drive the bitline 1001 with a bitline signal and the second transfer gate to transfer the bitline signal into the sense amplifier and the comparator 1002, prior to enabling the sense amplifier. During this period of time, the first transfer gate maintains a balanced loading and the setting of the comparison voltage (VDD) on the SA node 1013. After the period of time has expired, the SAE signal goes high turning OFF both of the first transfer gate and the second transfer gate. Turning OFF the second transfer gate isolates the loading of the bitline 1001 from the sense amplifier.

The tuned delay 1050 receives the sense amp enable SAE signal 1058 and without inversion generates the delayed sense amp enable (SAED) signal 1059. That is, the tuned delay 1050 is non inverting and the delayed sense amp enable (SAED) signal 1059 is a controlled time delay version of the SAE signal 1058.

The delayed sense amp enable (SAED) signal 1059 is coupled as a first input into the NAND gate 1007. The SAB node 1011 is coupled into a second input of the NAND gate 1007. If either of the SAED signal or the SAB node is low, the NAND gate generates a high as the SACTRL signal to turn ON the NFET 1016. If both the SAED signal and the SAB node are high, the NAND gate generates a low as the SACTRL signal to turn OFF the NFET 1016 and turn ON the PFET 1008. This is the case, if a logical zero is being read out of the memory cell. In this case, the comparator 1002 of the sense amplifier remains OFF with the NFET 1016 turned OFF during the read access thereby conserving power. That is, even if NFET 1015 is turned ON in response to the sense amp enable SAE signal 1058, NFET 1016 remains shut OFF in response to the SACTRL signal 1020 if a logical zero is being read out from the memory cell. Even with NFET 1015 turned OFF, NFET 1016 helps to further conserve power by reducing current leakage to ground when turned OFF.

If a logical zero is being read out of the memory cell, the SAB node 1011 is to be maintained at a high level. The source, gate and drain of the PFET 1008 are respectively coupled to VDD, the SACTRL signal 1020, and the SAB node 1011. In this case, PFET 1008 is turned ON and pulls up on the SAB node 1011 to keep it at a high level. With the second transfer gate turned OFF and the comparator shut OFF, PFET 1008 is ON to keep the SAB node 1011 from floating to a low level when SAB node 1011 is supposed to be high and driving out a logical zero.

The comparator 1002 is turned ON to read a logical one out of the memory cell. The NFET 1015 of the comparator is turned ON in response to the sense amp enable SAE signal 1058. The NFET 1016 may be turned ON after the NFET 1015 in response to the sense amp control SACTRL signal 1020, if a logical one is being read out from the memory cell. If both NFET 1015 and NFET 1016 are turned ON, the SAPD node 1017 is pulled down towards the negative power supply VSS or GND, enabling the comparator 1002 to make a comparison between the input voltages on the SA node 1013 and the SAB node 1011. With the SAB node 1011 being pulled down towards a low level, the SA node 1013 remaining at a high level, and the comparator 1002 turned ON, the SAB node 1011 is further pulled down by NFET 1014A and NFETs 1015–1016 coupled to VSS. Furthermore with the SAB node 1011 being pulled down towards a low level, PFET 1012B is turned ON and NFET 1014B is turned OFF such that the SA node 1013 is further pulled up by PFET 1012B coupled to VDD. In this manner, the comparator 1002 tends to amplify a small voltage difference between the SA node 1013 and the SAB node 1011 into a large voltage difference when reading a logical one out of the memory cell.

Inverter 1006 has its input coupled to the SAB node 1011 and its output coupled to the sense amplifier output (SAOUT) 1010. The inverter 1006 inverts the signal on the SAB node 1011 to generate the sense amplifier output (SAOUT) 1010 and drive one of the bits (Dbi) of the data I/O bus.

In FIG. 10B, a delay controlled zero sensitive (DCZS) sense amplifier 1000B is illustrated coupled to the tuned delay 1050 and an inverter 1051. The delay controlled zero sensitive (DCZS) sense amplifier 1000B is similar to the delay controlled zero sensitive (DCZS) sense amplifier 1000A illustrated by FIG. 10A. The difference being in the formation of the first transfer gate and the second transfer gate. In FIG. 10A, PFETs were used to implement the first and second transfer gates. In FIG. 10B, NFETs are used to implement the first and second transfer gates. Coupled together as shown, the sense amplifier 1000B includes the comparator 1002, the first transfer gate provided by NFET 1004A, the second transfer gate provided by NFET 1004B, the balancing circuit 1005, the inverter or buffer 1006, and the control circuit provided by the NAND gate 1007 and the pull-up transistor, PFET 1008.

The first transfer gate is provided by NFET 1004A. The source, gate, and drain of NFET 1004A are respectively coupled to VDD, the SAEP signal 1058', and the SA node 1013. As the sense amplifier is single ended, the first transfer gate balances the load and the initial voltage applied to the SA node 1013, mirroring what is initially seen by the SAB node 1011. The first transfer gate also sets the comparison voltage used by the comparator 1005 to compare with the signal on the bitline 1001.

The second transfer gate is provided by NFET 1004B. The source, gate, and drain of NFET 1004B are respectively coupled to the BL# or BLB bitline 1001, the SAEP signal 1058', and the SAB node 1011. The second transfer gate couples the signal on the bitline 1001 into the sense amplifier 1000C when SAE signal 1058 is low and disabling the sense amplifier. The second transfer gate decouples the signal on the bitline 1001 from the sense amplifier 1000C when SAE signal 1058 is high and enabling the sense amplifier.

The inverter 1051 inverts the SAE signal 1058 to generate the SAEP signal 1058' that drives the gates of the NFETS 1004A–1004B of the first and second transfer gates. When the SAE signal is high, the SAEP signal is low turning OFF the NFETs 1004A–1004B. When the SAE signal is low, the SAEP signal is high turning ON the NFETs 1004A–1004B. Thus, the SAEP signal can turn the NFETS 1004A–1004B ON and OFF.

The signals generated by the tuned delay 1050 and the inverter 1051 may be globally used by all the sense amplifiers for each data bit output desired as part of the timing control block 408 in one embodiment of the invention. In another embodiment of the invention, the tuned delay 1050 and the inverter 1051 may be provided for each sense amplifier as a part thereof with only the SAE signal being globally provided to each sense amplifier.

Otherwise, the implementation and functionality of the delay controlled zero sensitive (DCZS) sense amplifier 1000B is similar to that previously described with reference to the delay controlled zero sensitive (DCZS) sense amplifier 1000A and is not repeated for reasons of brevity.

In FIG. 10C, a delay controlled zero sensitive (DCZS) sense amplifier 1000C is illustrated coupled to the tuned delay 1050 and the inverter 1051. The delay controlled zero sensitive (DCZS) sense amplifier 1000C is similar to the delay controlled zero sensitive (DCZS) sense amplifier 1000A illustrated by FIG. 10A and the delay controlled zero sensitive (DCZS) sense amplifier 1000B illustrated by FIG. 10B. The difference being in the formation of the first transfer gate and the second transfer gate. In FIG. 10A, PFETs were used to implement the first and second transfer gates. In FIG. 10B, NFETs were used to implement the first and second transfer gates. In FIG. 10C, both PFETs and NFETs are used to implement the first and second transfer gates. Coupled together as shown, the sense amplifier 1000C includes the comparator 1002, the first transfer gate provided by PFET 1003A and NFET 1004A coupled in parallel together, the second transfer gate provided by PFET 10003B and NFET 1004B coupled in parallel together, the balancing circuit 1005, the inverter or buffer 1006, and the control circuit provided by the NAND gate 1007 and the pull-up transistor, PFET 1008.

The first transfer gate is provided by PFET 1003A and NFET 1004A coupled in parallel together. The source, gate, and drain of PFET 1003A are respectively coupled to VDD, the SAE signal 1058, and the SA node 1013. The source, gate, and drain of NFET 1004A are respectively coupled to VDD, the SAEP signal 1058', and the SA node 1013. As the sense amplifier is single ended, the first transfer gate balances the load and the initial voltage applied to the SA node 1013, mirroring what is initially seen by the SAB node 1011. The first transfer gate also sets the comparison voltage used by the comparator 1005 to compare with the signal on the bitline 1001.

The second transfer gate is provided by PFET 1003B and NFET 1004B coupled in parallel together. The source, gate, and drain of PFET 1003B are respectively coupled to the bitline bar (BLB, may also be referred to as the negative bitline or inverted bitline) 1001, the SAE signal 1058, and the SAB node 1011. The source, gate, and drain of NFET 1004B are respectively coupled to the BLB bitline 1001, the SAEP signal 1058', and the SAB node 1011. The second transfer gate couples the signal on the bitline 1001 into the sense amplifier 1000C when SAE signal 1058 is low and disabling the sense amplifier. The second transfer gate decouples the signal on the bitline 1001 from the sense amplifier 1000C when SAE signal 1058 is high and enabling the sense amplifier.

The inverter 1051 inverts the SAE signal 1058 to generate the SAEP signal 1058' that drives the gates of the NFETS 1004A–1004B of the first and second transfer gates. When the SAE signal is high turning OFF the PFETs 1003A–1003B, the SAEP signal is low turning OFF the NFETs 1004A–1004B. When the SAE signal is low turning ON the PFETs 1003A–1003B, the SAEP signal is high turning ON the NFETs 1004A–1004B. Thus, the SAE signal and the SAEP signal can turn the PFETS 1003A–1003B and the NFETS 1004A–1004B ON and OFF together.

Otherwise, the implementation and functionality of the delay controlled zero sensitive (DCZS) sense amplifier 1000C is similar to that previously described with reference to the delay controlled zero sensitive (DCZS) sense amplifier 1000A and is not repeated for reasons of brevity.

In FIG. 10D, a delay controlled zero sensitive (DCZS) sense amplifier 1000D is illustrated coupled to a tuned delay 1050. The delay controlled zero sensitive (DCZS) sense amplifier 1000D is doubled ended but is similar to the delay controlled zero sensitive (DCZS) sense amplifier 1000A illustrated by FIG. 10A, the delay controlled zero sensitive (DCZS) sense amplifier 1000B illustrated by FIG. 10B, and the delay controlled zero sensitive (DCZS) sense amplifier 1000C illustrated by FIG. 10C which are single ended. The difference from the delay controlled zero sensitive (DCZS) sense amplifier 1000A illustrated by FIG. 10A is in how the sense amplifier couples to the bitlines. In FIG. 10D, the first transfer gate of the sense amplifier couples to the positive bit line 1001A and the second transfer gate couples to the negative bitline 1001B. In FIG. 10A, the first transfer gate of the sense amplifier couples to VDD as opposed to the positive bitline BL 1001A.

Coupled together as shown, the sense amplifier 1000D includes the comparator 1002, the first transfer gate provided by PFET 1003A', the second transfer gate provided by PFET 10003B, the balancing circuit 1005, the inverter or buffer 1006, and the control circuit provided by the NAND gate 1007 and the pull-up transistor, PFET 1008.

With both the positive and negative bitlines being coupled into the sense amplifier 1000D, a differential signal may more quickly develop between the SA node 1013 and the SAB node 1011.

Otherwise, the implementation and functionality of the delay controlled zero sensitive (DCZS) sense amplifier 1000D is similar to that previously described with reference to the delay controlled zero sensitive (DCZS) sense amplifier 1000A and is not repeated for reasons of brevity.

While the sense amplifiers illustrated in FIGS. 10A–10D have been implemented to support a pre-charge bitline preconditioning, after viewing the drawings and reading this disclosure, it will be obvious to one of ordinary skill in the art how to modify the sense amplifiers of FIGS. 10A–10D to support a pre-discharge bitline preconditioning.

The logical operation of the sense amplifiers illustrated in FIGS. 10A–10D can be briefly summarized by the simple truth-table shown in FIG. 12. The upper row indicates the case when reading a logical one. The lower row indicates the case of reading a logical zero.

When precharging bitlines, the negative bitline BLB 1001 is set to a high level. Additionally, the internal nodes SA 1011 and SAB 1013 of the sense amp are also precharged to a high level and the inverter 1006 inverts the high level on SAB node 1013 such that the output of the sense amplifier SAOUT 1010 is already at a low level and ready to drive out a logical zero.

When reading a logical zero out of the memory, a high level or "1" is driven onto the negative bitline BLB 1001 and onto the SAB node 1013. Thus, with the internal nodes SA and SAB of the sense amp precharged so that the SAB node 1013 is already in the high state to read out a logical zero, the sense amplifier can be turned OFF during the read access of a logical zero and hold the precharged state.

When reading a logical one out of the memory, a low level or "0" is driven onto the negative bitline BLB 1001 and onto the SAB node 1013. The sense amplifier is turned ON in order to further transition the SAB node 1013 from a high level at precharge to a low level during read access while maintaining the SA node 1011 at a high level. In other words, while reading a logical one, the sense amplifier is turned ON and functions ordinarily.

The functionality of the DCZS sense amplifier is now described in a little greater detail with reference to FIGS. 10A, 12, and 13A–13B.

Figure 13A:
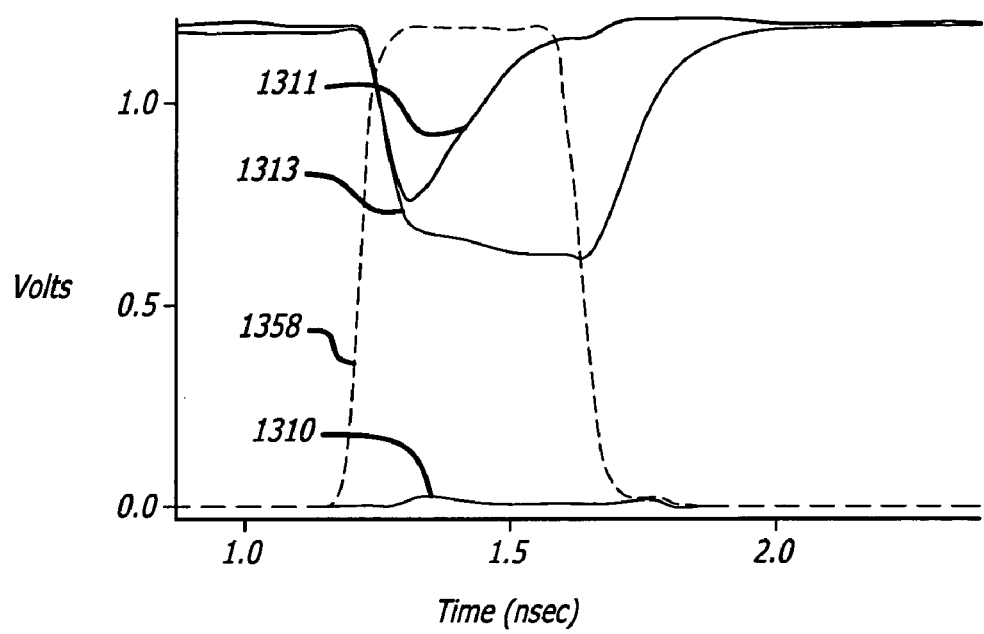
FIG. 13A illustrates a waveform diagram of reading a logical zero with a delay controlled zero sensitive (DCZS) sense amplifier.
Figure 13B:
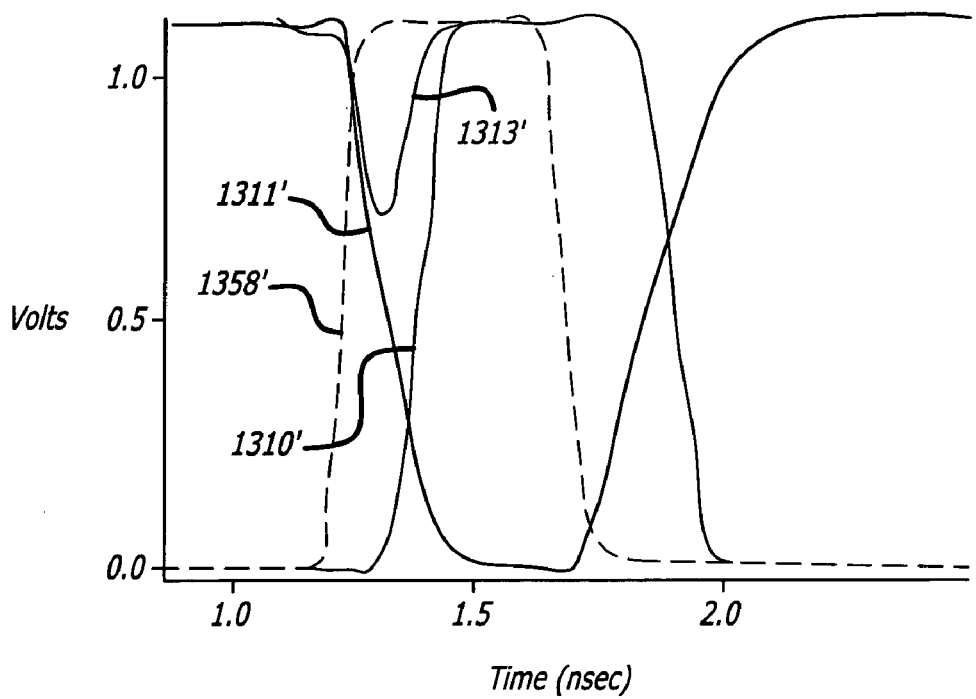
FIG. 13B illustrates a waveform diagram of reading a logical one with a delay controlled zero sensitive (DCZS) sense amplifier.

During precharge, the sense amplifier 1000A is inactive as the SAE signal 1058 is at a low level such that transistor 1015 is turned OFF and the transfer gates of PFETs 1003A–1003B are turned ON. While the negative bitline BLB 1001 is precharged to VCC, so is the SAB node 1011 and the SA node 1013. The SAB node 1001 is precharged as it is coupled to the BLB bitline 1001 through the PFET 1003B. The SA node 1013 is precharged as it is coupled to VCC through the PFET 1003A. Thus during precharge, both the SA node 1013 and the SAB node 1011 are precharged to VCC. In FIGS. 13A–13B, prior to the SAE waveform 1358,1358' going high and enabling the sense amplifier, the SA and SAB nodes are precharged high as illustrated by the SA waveforms 1313,1313' and the SAB waveforms 1311, 1311'.

During precharge with the SAE signal 1058 at a low level, the SAED signal 1059 is also at a low level. Thus, the output of the NAND gate 1007, SACTRL 1020, is high during precharge so that the NFET 1016 is turned ON and the node between the NFET 1015 and NFET 1016 is pulled to VSS or ground. Once the SAE signal 1058 goes to a high level, the comparator 1002 and the sense amplifier are ready to become active and turn ON.

As previously discussed, while reading a logical zero from memory the DCZS sense amplifier is turned OFF. The control circuitry of the sense amplifier in conjunction with the tuned delay circuit 1050 generates control signals to turn OFF the DCZS sense amplifier at the right time. The tuned delay circuit 1050 generates the delayed sense amp enable signal SAED 1059. The NAND gate 1007 in response to a high level from the SAED signal 1059 and a high level from the SAB node 1011, will generate a high level in the SACTRL control signal 1020.

When reading a logical zero, both of the SA node 1013 and the SAB node 1011 are set near high levels from precharging such that when the SAE signal 1058 goes active high, the comparator 1002 is turned ON and the SA node 1013 and the SAB node 1011 initially start going down as is illustrated in waveforms 1313 and 1311, respectively. The tuned delay circuit 1050 is tuned to appropriately generate the SAED signal 1059 to generate the SACTRL signal and turn OFF the sense amplifier when reading a logical zero. In one embodiment, the SACTRL signal goes to a low level before the SAB node 1011 reaches one half of the voltage of the positive power supply (VDD/2). In another embodiment, the SACTRL signal goes to a low level before the SAB node 1011 reaches the trip point of an inverter. In either case, with the SACTRL signal 1020 at a low level, the comparator and the sense amplifier are in effect turned OFF.

The SACTRL signal 1020 is also coupled to the gate of the pull-up PFET 1008. With the SACTRL signal 1020 at a low level, the PFET 1008 pulls the SAB node 1011 back to a high level when the sense amp is shut-off. The pull-up PFET functions as a keeper device and avoids SAB node 1011 from floating or hanging when the sense amplifier is turned OFF, there by increasing noise immunity of the node during the reading of a logical one. When reading a logical zero, there is no change in the logic value of the SAOUT node 1010 that originally drives out a logical zero as is illustrated by waveform 1310. Thus, there is virtually no read access delay time when reading a logical zero, the most frequently read state from memory.

When reading a logical one, both of the SA node 1013 and the SAB node 1011 are set near high levels from precharging such that when the SAE signal 1058 goes active high, the comparator 1002 is turned ON and the SA node 1013 and the SAB node 1011 initially start going down as is illustrated in waveforms 1313' and 1311', respectively. As discussed previously, the tuned delay circuit 1050 is tuned to appropriately generate the SAED signal 1059 to generate the SACTRL signal and turn OFF the sense amplifier when reading a logical zero. The tuned delay circuit 1050 is also tuned to appropriately generate the SAED signal 1059 when reading a logical one. When reading a logical one, the tuned delay circuit 1050 should provide sufficient delay so that the BLB bitline 1001 and the SAB node 1011 can be pulled down by a memory cell. In one embodiment of the invention, the delay provided by the tuned delay circuit 1050 is greater than the time it takes a memory cell to pull down the SAB node 1011. Without the tuned delay circuit 1050, a downward glitch may appear on the SACTRL signal 1020 which may adversely affect the operation of the sense amplifier.

Initially the BLB bitline 1001 is precharged to a high level with the SA node 1013 and the SAB node 1011. When performing a read access, precharging is turned off and the address decoder turns on a word line to allow data stored into the memory cell to drive the BLB bitline 1001. When reading a logical one, the BLB bitline 1001 starts to discharge. While the second transfer gate is ON, charge is transferred across it so that the SAB node tracks the BLB bitline. Thus, the voltage of the SAB node 1011 is driven to a lower potential than that of the SA node 1013. With the SAB node 1011 being driven towards a low level, the SACTRL signal is driven to a high level by the NAND gate 1007 turning ON the NFET 1016. As soon as SAE is turned ON, the first transfer gate and the second transfer gate turn OFF isolating the BLB bitline from the sense amplifier and NFET 1015 is turned ON. With both NFETs 1015–1016 turned ON, the SAPD node 1017 start to go down and the sense amp will amplify the difference between the voltages on the SA node 1013 and the SAB node 1011, eventually pulling the SAB node 1011 completely down to a low level such as VSS or ground and thereby causing the inverter 1006 to drive out a logical one onto the sense amplifier output SAOUT 1010.

When reading a logical one, both NFETs 1015–1016 may need to be turned ON to properly evaluate the BLB bitline. As these two NFETs are pulldowns in series of the comparator, there is a delay between the SAE signal turning on the sense amplifier and the generation of the logical one on SAOUT in this differential case of reading a logical one.

Referring now to FIGS. 11A–11B, embodiments of the tuned delay 1050 are illustrated.

In FIG. 11A, a tuned delay circuit 1050A is illustrated. The tuned delay circuit 1050A includes a pair of inverters 1101A–1101B coupled in series as shown. The pair of inverters 1101A–1101B are each carefully designed for their dimensions of width and length so as to generate an appropriate time delay in the delayed sense amp enable signal SAED 1059 from the sense amp enable signal SAE 1058. As a pair of inverters are used, the tuned delay circuit 1050A is non-inverting.

Inverter 1101A of the pair of inverters 1101A–1101B receives the SAE signal 1058. The pair of inverters 1101A and 1101B generate a delayed version of the SAE signal as the SAED signal 1059. In one embodiment of the invention, the pair of inverters 1101A–1101B may be tuned in such a way that the delay between waveforms is more than the time it takes to pull the SAB node to be pulled down to ground when reading a logical one. In another embodiment of the invention, the delay between waveforms is greater than the time it takes for the SAB node 1011 to discharge for the differential case of reading a logical one and smaller than the time it takes for SAB node 1011 to go to one half of the positive power supply (VDD/2) for the non-differential case or reading a logical zero.

In FIG. 11B, a tuned delay circuit 1050B is illustrated. The tuned delay circuit 1050B includes N pairs of inverters' 111A–1110N coupled in series as shown. Each of the N pairs of inverters includes a first inverter 1102A coupled in series with a second inverter 1102B so that each is non-inverting.

As N pairs of inverters 1110A–1110N are used to provide the tuned delay, the dimensions of width and length are less important to generate an appropriate time delay in the delayed sense amp enable signal SAED 1059 from the sense amp enable signal SAE 1058. As N pairs of inverters are used in series, resulting in an even number of inversions, the tuned delay circuit 1050B is also non-inverting.

Referring now to FIG. 13A, a waveform diagram of reading a logical zero with a delay controlled zero sensitive (DCZS) sense amplifier is illustrated. FIG. 13A illustrates voltage on the Y axis and time on the X axis. An SAOUT waveform 1310, an SAB waveform 1311, an SA waveform 1313, and an SAE waveform 1358 respectively correspond to the SAOUT 1010, the SAB node 1011, the SA node 1013, and the SAE signal 1058 illustrated in FIGS. 10A–10D.

When reading a logical zero, it is expected that the SAB node 1011 would remain high as illustrated by the SAB waveform 1311. Typically, the SA node 1013 would discharge towards VSS or ground. However, the SA node 1013 doesn't discharge all the way to ground during the reading of a logical zero either, as is illustrated by the SA waveform 1313 in FIG. 13A. This is because while reading a logical zero, the DCZS sense amplifier shuts OFF after a brief delay, even though the SAE signal is high to turn ON the sense amplifiers, as is illustrated by the SAE waveform 1358. During the reading of a logical zero, the sense amplifier output SAOUT 1010 doesn't change state, as illustrated by the SAOUT waveform 1310.

Turning OFF the sense amplifier avoids using power to perform a comparison and can conserve a significant amount of power. As the SA node 1013 doesn't discharge all the way to ground during the reading of a logical zero, less time and power is needed to precharge it back to its initialized state. Considering that reading a logical zero is more frequent, the power savings provided by a DCZS sense amplifier for all the bits in a memory adds up significantly over time.

Referring now to FIG. 13B, a waveform diagram of reading a logical one with a delay controlled zero sensitive (DCZS) sense amplifier is illustrated. FIG. 13B illustrates voltage on the Y axis and time on the X axis. An SAOUT waveform 1310', an SAB waveform 1311', an SA waveform 1313', and an SAE waveform 1358' respectively correspond to the SAOUT 1010, the SAB node 1011, the SA node 1013, and the SAE signal 1058 illustrated in FIGS. 10A–10D.

When reading a logical one, the SAB node 1011 is discharged towards ground while the SA node 1013 remains high as illustrated by the SAB waveform 1311 and the SA waveform 1313' respectively. In this case, the DCZS sense amplifier remains turned ON during the sense amp enable SAE signal with the comparator fully evaluating signals on the SAB node and the SA node. While this consumes some power, power can be conserved overall in a memory by using a single ended DCZS sense amplifier with a single bitline and a single ended memory cell, such as memory cell 401A illustrated in FIG. 5A. This is because only a single bitline need be precharged and discharged when reading a logical one.

Figure 14:
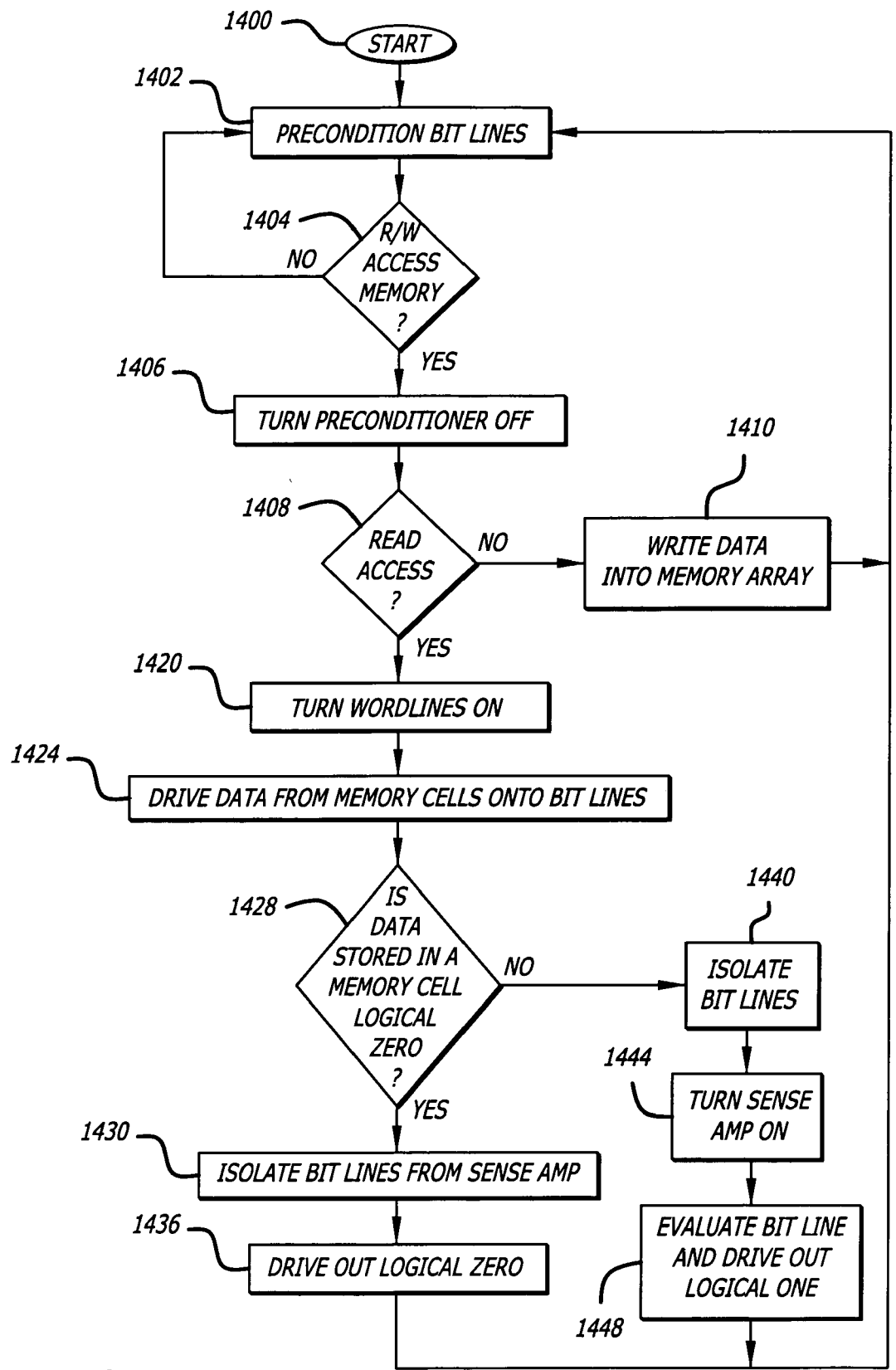
FIG. 14 illustrates a flow chart of a method of access into memory using a delay controlled zero sensitive (DCZS) sense amplifier.

Referring now to FIG. 14, a flow chart of a method of access into memory using a delay controlled zero sensitive (DCZS) sense amplifier is illustrated. The method starts at block 1400 and jumps to block 1402 where the bitlines in the memory are preconditioned. As discussed previously, the bitlines may be precharged high or predischarged low and the memory cell changes the state of the bitline if it drives out a low level or a high level, respectively. That is, the bitlines are preconditioned to a state associated with a logical zero.

At block 1404, a determination is made if an access, read or write, is to be made with the memory. If not, the method goes back to block 1402 and the preconditioning of the bitlines. If it is a memory access, the method jumps to block 1406.

At block 1406, the bitline preconditioning is turned OFF in order to access the memory. The method then goes to 1408.

At block 1408, a determination is made if the memory access is to be a read access or a write access. If it is not a read access it is a write access and the method jumps to block 1410. At block 1410, the data is written into the memory array. If the memory access is a read access, the method jumps to block 1420.

At block 1420, the wordlines are turned on in response to an address in order to address and selectively read access one or more memory cells and read the data therein. Next at block 1424, with the wordlines turned on, the memory cells can drive data out onto the bitlines.

Next at block 1628, a determination is made as to whether or not the data stored in the memory cell corresponds to a logical zero. If so, the process goes to block 1430. If not, a logical one was stored in the memory cell and it needs to be properly evaluated so the process goes to block 1440.

At block 1430, the bitlines are isolated from the sense amplifier in response to the sense amp enable signal. Next at block 1436, a logical zero is driven out from the sense amp onto a data bit of the data I/O lines. Without turning on the sense amplifier/comparator, or only momentarily, the logical zero is output from the sense amplifier. That is, the comparator does not evaluate the data on the bitline when the data stored in the memory cell corresponds to a logical zero. The process then returns to block 1402 and the bitlines are preconditioned once again.

At block 1440, the bitlines are isolated from the sense amplifier in response to the sense amp enable signal. Next at block 1444, the sense amplifier/comparator is turned on by the control signals. Then at block 1448, the bitline is evaluated to determine that a logical one was indeed stored in the memory cell and the logical one is driven out from the sense amplifier. The process then returns to block 1402 and the bitlines are preconditioned once again.

Power is becoming more and more of a limiting factor in today's high performance micro processor designs. The embodiments of the invention with a DCZS sense amplifier can conserve power and speed up read access times for the more frequent case of reading a logical zero from memory. By conserving power, one large on-chip cache memory or more than one on-chip cache memories having a plurality of single ended DCZS sense amplifiers can be used. Embodiments of the invention with the single ended DCZS sense amplifiers can also be used in mobile battery powered applications in order to extend the time between charging.

While certain exemplary embodiments have been described and shown in the accompanying drawings, it is to be understood that such embodiments are merely illustrative of and not restrictive on the broad invention, and that the embodiments of the invention not be limited to the specific constructions and arrangements shown and described, since various other modifications may occur to those ordinarily skilled in the art.

What is claimed is:

1. An integrated circuit including:
   a sense amplifier to read data from a memory cell, the sense amplifier comprising
   a first transfer gate having a first pole coupled to a positive power supply;

a second transfer gate having a first pole coupled to a bitline of the memory cell;

a comparator having a first input coupled to a second pole of the first transfer gate, a second input coupled to a second pole of the second transfer gate, the comparator to compare signals on the first input and the second input and to selectively generate a greater differential signal there-between; and a control circuit coupled to the comparator, the control circuit to turn off the comparator in response to a logical zero being read from the memory cell.

2. The integrated circuit of claim 1, wherein the sense amplifier further comprises
an inverter having an input coupled to the output of the comparator, the inverter to invert and drive out the read data from the memory cell.

3. The integrated circuit of claim 1, wherein the sense amplifier further comprises
a balancing circuit coupled to the first input of the comparator, the balancing circuit to balance a load experienced by the comparator on the second input.

4. The integrated circuit of claim 3, wherein the load of the control circuit on the second input of the comparator is balanced by the balancing circuit.

5. The integrated circuit of claim 1, wherein in the sense amplifier
the first transfer gate is a p-channel field effect transistor (PFET) having a source coupled to a positive power supply, a drain coupled to the first input of the comparator, and a gate coupled to a sense amp enable signal, and
the second transfer gate is a p-channel field effect transistor (PFET) having a source coupled to bitline, a drain coupled to the second input of the comparator, and a gate coupled to the sense amp enable signal.

6. The integrated circuit of claim 1, wherein in the sense amplifier
the first transfer gate is an n-channel field effect transistor (NFET) having a source coupled to a positive power supply, a drain coupled to the first input of the comparator, and a gate coupled to an inverted sense amp enable signal, and
the second transfer gate is an n-channel field effect transistor (NFET) having a source coupled to bitline, a drain coupled to the second input of the comparator, and a gate coupled to the inverted sense amp enable signal.

7. The integrated circuit of claim 1, wherein in the sense amplifier
the first transfer gate is an n-channel field effect transistor (NFET) coupled in parallel with a p-channel field effect transistor (PFET), the NFET having a drain and the PFET having a source coupled to a positive power supply, the NFET having a source and the PFET having a drain coupled to the first input of the comparator, the NFET having a gate coupled to an inverted sense amp enable signal, and the PFET having a gate coupled to a sense amp enable signal, and
the second transfer gate is an n-channel field effect transistor (NFET) coupled in parallel with a p-channel field effect transistor (PFET), the NFET having a drain and the PFET having a source coupled to the bitline, the NFET having a source and the PFET having a drain coupled to the second input of the comparator, the NFET having a gate coupled to the inverted sense amp enable signal, and the PFET having a gate coupled to the sense amp enable signal.

8. The integrated circuit of claim 1, wherein in the sense amplifier the control circuit includes
a NAND gate having a first input coupled to a delayed sense amp enable signal, a second input coupled to the second input of the comparator, and an output coupled to the comparator to switch,
and a pull-up PFET having a source coupled to the positive power supply, a drain coupled to the second input of the comparator, and a gate coupled to an output of the NAND gate;
and the comparator includes
a pull-down NFET having a gate coupled to the output of the NAND gate, the pull-down NFET to turn ON and OFF the comparator.

9. The integrated circuit of claim 8, further comprising:
a tuned delay circuit coupled to the sense amplifier, the tuned delay circuit to generate the delayed sense amp enable signal having a time delay from and in response to the sense amp enable signal.

10. The integrated circuit of claim 9, wherein the time delay from the sense amp enable signal is less than the time it takes for the second input of the comparator to be driven to one half of the positive power supply when reading the logical zero from the memory cell.

11. A method comprising:
addressing a memory cell to read data therein;
driving the data in the memory cell onto a bitline;
determining if the data in the memory cell is associated with a logical zero; and
if the data in the memory cell is associated with a logical zero then
driving out a logical zero being read from the memory cell without a comparator evaluating the data on the bitline to conserve power.

12. The method of claim 11, further comprising:
prior to addressing the memory cell, preconditioning the bitline to a state associated with a logical zero.

13. The method of claim 12, further comprising:
prior to addressing the memory cell and after preconditioning the bitline, determining a read access into the memory cell.

14. The method of claim 11, wherein
if the data in the memory cell is associated with a logical zero then
prior to driving out a logical zero, isolating the bitline from the comparator in response to a sense enable signal.

15. The method of claim 11, wherein
if the data in the memory cell is associated with a logical one then
isolating the bitline from the comparator in response to a sense enable signal,
turning ON the comparator, and
evaluating the signal on the bitline and driving out a logical one is read from the memory cell.

16. A system comprising:
a memory including
one or more memory cells coupled to a bitline;
a preconditioner coupled to the bitline; and
a sense amplifier coupled to the bitline, the sense amplifier having
a first transfer gate having a first pole coupled to a positive power supply;

a second transfer gate having a first pole coupled to the bitline;

a comparator having a first input coupled to a second pole of the first transfer gate, a second input coupled to a second pole of the second transfer gate, the comparator to selectively compare signals on the first input and the second input and generate a differential signal between the first input and the second input; and a control circuit coupled to the comparator, the control circuit to turn off the comparator in response to a logical zero being read from the memory cell and avoid generating the differential signal between the first input and the second input.

17. The system of claim 16, further comprising:
one or more processors to execute instructions and process data.

18. The system of claim 16, wherein
the memory is a cache memory and the one or more memory cells are static random access memory (SRAM) cells.

19. The system of claim 16, wherein
the preconditioner is one of a p-channel field effect transistor (PFET) to precharge the bitline, an n-channel field effect transistor (NFET) to precharge the bitline, a p-channel field effect transistor (PFET) to predischarge the bitline, and an n-channel field effect transistor (NFET) to predischarge the bitline.

20. A sense amplifier comprising:
a first p-channel field effect transistor (PFET) having a source coupled to a positive power supply and a gate coupled to a sense amp enable signal, the first PFET to provide a comparison voltage;

a second PFET having a source coupled to a bitline and a gate coupled to the sense amp enable signal;

a controllable comparator having a first input coupled to a drain of the first PFET and a second input coupled to a drain of the second PFET, the controllable comparator to compare signals on the first input and the second input in response to the sense amp enable signal and a control signal, wherein the first PFET to selectively provide a comparison voltage to the first input of the controllable comparator and the second PFET to selectively provide a signal on the bitline to the second input of the controllable comparator; and a control circuit having a first input coupled to the second input of the controllable comparator, a second input coupled to a delayed sense amp enable signal, and an output coupled to the controllable comparator, the control circuit to generate the control signal to turn on the controllable comparator in response to a logical one being read from a memory cell and to turn off the controllable comparator in response to a logical zero being read from the memory cell.

21. The sense amplifier of claim 20, wherein
the control circuit includes
a NAND gate having a first input coupled to the second input of the controllable comparator, and a second input coupled to a delayed sense amp enable signal, and output coupled to the controllable comparator, the NAND gate to generate the control signal on the output of the NAND gate.

22. The sense amplifier of claim 21, wherein
the control circuit further includes
a third PFET having a source coupled to the positive power supply, a drain coupled to the second input of the controllable comparator, and a gate coupled to the output of the NAND gate, the third PFET to pull up on the second input in response to the control signal and a logical zero being read from the memory cell.

23. The sense amplifier of claim 20, wherein
the controllable comparator includes
a first n-channel field effect transistor (NFET) having a source coupled to a negative power supply, a gate coupled to the control circuit to receive the control signal, and a drain;
a second NFET having a source coupled to the drain of the first NFET, a gate to receive the sense amp enable signal, and a drain to selectively provide the negative power supply to the controllable comparator, and
wherein the negative power supply is selectively provided to the controllable comparator in response to the control signal and the sense amp enable signal coupled to the first NFET and the second NFET, respectively.

24. The sense amplifier of claim 23, wherein
the controllable comparator further includes
a third PFET having a source coupled to the positive power supply, a gate coupled to the first input, and a drain coupled to the second input,
a fourth PFET having a source coupled to the positive power supply, a gate coupled to the second input, and a drain coupled to the first input,
a third NFET having a source coupled to the drain of the second NFET to selectively receive the negative power supply, a gate coupled to the first input, and a drain coupled to the second input, and
a fourth NFET having a source coupled to the drain of the second NFET to selectively receive the negative power supply, a gate coupled to the second input, and a drain coupled to the first input.

25. The sense amplifier of claim 20, further comprising:
an inverter coupled to the second input of the controllable comparator; and
a balancing circuit coupled to the first input to balance loading on the controllable comparator.

* * * * *